US009140724B1

(12) United States Patent
Campbell

(10) Patent No.: US 9,140,724 B1
(45) Date of Patent: *Sep. 22, 2015

(54) COMPENSATING RESISTANCE PROBING TIP OPTIMIZED ADAPTERS FOR USE WITH SPECIFIC ELECTRICAL TEST PROBES

(75) Inventor: Julie A. Campbell, Beaverton, OR (US)

(73) Assignee: LeCroy Corporation, Chestnut Ridge, NY (US)

( * ) Notice: Subject to any disclaimer, the term of this patent is extended or adjusted under 35 U.S.C. 154(b) by 619 days.

This patent is subject to a terminal disclaimer.

(21) Appl. No.: 13/292,072

(22) Filed: Nov. 8, 2011

Related U.S. Application Data

(63) Continuation-in-part of application No. 12/715,269, filed on Mar. 1, 2010, now Pat. No. 8,098,078, which is a continuation of application No. 11/650,368, filed on Jan. 5, 2007, now Pat. No. 7,671,613.

(60) Provisional application No. 61/437,635, filed on Jan. 29, 2011, provisional application No. 60/757,077, filed on Jan. 6, 2006.

(51) Int. Cl.
G01R 31/20 (2006.01)
G01R 1/067 (2006.01)

(52) U.S. Cl.
CPC ........ *G01R 1/06788* (2013.01); *G01R 1/06738* (2013.01)

(58) Field of Classification Search
None
See application file for complete search history.

(56) References Cited

U.S. PATENT DOCUMENTS

| 3,072,877 | A | | 1/1963 | Landwher |
| 3,676,776 | A | | 7/1972 | Bauer et al. |
| 3,885,848 | A | | 5/1975 | Brouneaus |
| 4,491,788 | A | | 1/1985 | Zandonatti |
| 4,552,464 | A | | 11/1985 | Rogers |
| 4,552,465 | A | | 11/1985 | Anderson |
| 4,626,805 | A | * | 12/1986 | Jones ............................... 333/33 |

(Continued)

FOREIGN PATENT DOCUMENTS

| JP | 01-2700391 | 10/1989 |
| JP | 04-086009 | 3/1992 |

OTHER PUBLICATIONS

TEKTRONIX, P6248 1.7 GHz (Typical) Differential Probe Instructions, 071-0566-01, as least as early as Jan. 25, 2011, pp. 4 and 5.

(Continued)

*Primary Examiner* — Paresh Patel
(74) *Attorney, Agent, or Firm* — Law Office of Karen Dana Oster, LLC

(57) ABSTRACT

A compensating resistance adapter spans the distance from a mechanical point of contact of an electrical test probe and at least one signal testing point. The compensating resistance adapter has at least one transmission path extending longitudinally therewith. At least one compensating network is configured with the transmission path and positioned substantially near the probing end thereof. For preferred compensating resistance adapters, the at least one compensating network compensates for inductance caused by the conductive connector adapter. For preferred compensating resistance adapters, the at least one compensating network when used in combination with the electrical test probe is optimized to the signal testing point. Exemplary preferred compensating resistance adapters include a probing blade adapter, a twisted pair adapter, a Y-lead adapter, and a swivel pogo tip pair adapter.

13 Claims, 18 Drawing Sheets

(56) References Cited

U.S. PATENT DOCUMENTS

| | | | |
|---|---|---|---|
| 4,740,746 A | | 4/1988 | Pollock et al. |
| 4,773,877 A | | 9/1988 | Kruger et al. |
| 4,923,407 A | | 5/1990 | Rice et al. |
| 4,965,514 A | * | 10/1990 | Herrick .................... 324/754.06 |
| 4,978,312 A | | 12/1990 | Fodali |
| 5,032,787 A | | 7/1991 | Johnston et al. |
| 5,151,040 A | | 9/1992 | Tanaka |
| 5,223,787 A | * | 6/1993 | Smith et al. ............... 324/755.01 |
| 5,914,612 A | | 6/1999 | Koken et al. |
| 5,967,856 A | | 10/1999 | Meller |
| 5,982,187 A | | 11/1999 | Tarzwell |
| 5,997,360 A | | 12/1999 | Gen-Kuong et al. |
| 6,083,059 A | | 7/2000 | Kuan |
| 6,137,302 A | | 10/2000 | Schwindt |
| 6,191,594 B1 | | 2/2001 | Nightingale et al. |
| D444,401 S | | 7/2001 | Campbell |
| D444,720 S | | 7/2001 | Campbell |
| 6,271,673 B1 | | 8/2001 | Furuta et al. |
| 6,292,701 B1 | | 9/2001 | Prass et al. |
| 6,363,605 B1 | | 4/2002 | Shih et al. |
| 6,400,167 B1 | | 6/2002 | Gessford et al. |
| 6,404,215 B1 | | 6/2002 | Nightingale et al. |
| 6,447,343 B1 | | 9/2002 | Zhang et al. |
| 6,462,529 B1 | | 10/2002 | Campbell |
| 6,464,511 B1 | | 10/2002 | Watanabe et al. |
| 6,518,780 B1 | | 2/2003 | Campbell et al. |
| 6,538,424 B1 | | 3/2003 | Campbell |
| 6,603,297 B1 | | 8/2003 | Gessford et al. |
| 6,617,864 B2 | * | 9/2003 | Inoue et al. ............... 324/750.27 |
| 6,630,833 B2 | * | 10/2003 | Scott ............................. 324/637 |
| 6,650,131 B2 | | 11/2003 | Campbell et al. |
| 6,704,670 B2 | * | 3/2004 | McTigue ........................ 702/66 |
| 6,791,345 B2 | | 9/2004 | Maruyama et al. |
| 6,809,535 B2 | | 10/2004 | Campbell |
| 6,828,768 B2 | | 12/2004 | McTigue |
| 6,863,576 B2 | | 3/2005 | Campbell et al. |
| 6,967,473 B1 | | 11/2005 | Reed et al. |
| 7,091,730 B1 | | 8/2006 | Parshotam et al. |
| 7,138,810 B2 | | 11/2006 | Lesher et al. |
| 7,140,105 B2 | | 11/2006 | Campbell |
| 7,242,173 B2 | | 7/2007 | Cavoretto |
| 7,262,614 B1 | | 8/2007 | Campbell |
| 7,294,995 B1 | * | 11/2007 | Stevens et al. ............... 324/72.5 |
| 7,371,093 B1 | | 5/2008 | Johnson |
| 7,436,191 B2 | * | 10/2008 | Yang ........................ 324/750.26 |
| 7,592,822 B2 | | 9/2009 | Reed et al. |
| 7,671,613 B1 | * | 3/2010 | Campbell ................. 324/754.11 |
| 7,777,509 B2 | * | 8/2010 | Halter et al. ............. 324/755.01 |
| 8,098,078 B1 | * | 1/2012 | Campbell ................. 324/754.11 |
| 2002/0052155 A1 | | 5/2002 | Campbell et al. |
| 2003/0189438 A1 | | 10/2003 | Campbell et al. |
| 2003/0193341 A1 | | 10/2003 | McTigue |
| 2004/0207417 A1 | | 10/2004 | Barr |
| 2005/0266733 A1 | * | 12/2005 | Martin et al. .................. 439/695 |
| 2006/0267605 A1 | * | 11/2006 | Yang et al. ..................... 324/754 |
| 2010/0060304 A1 | * | 3/2010 | Roland et al. .................. 324/754 |

OTHER PUBLICATIONS

TEKTRONIX, P6248 1.7 GHz (Typical) Differential Probe Service Manual, 071-0566-03, as least as early as Jan. 29, 2011, pp. 33 and 34.

TEKTRONIX, P6248 1.7 GHz (Typical) Differential Instructions, 071-0566-03, as least as early as Jan. 29, 2011, pp. 1-7.

* cited by examiner

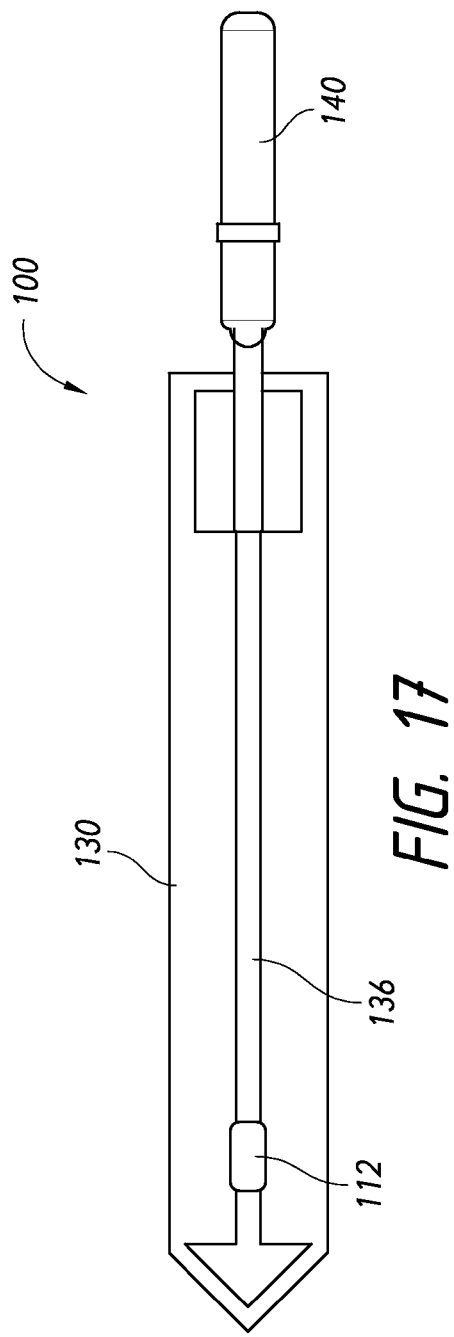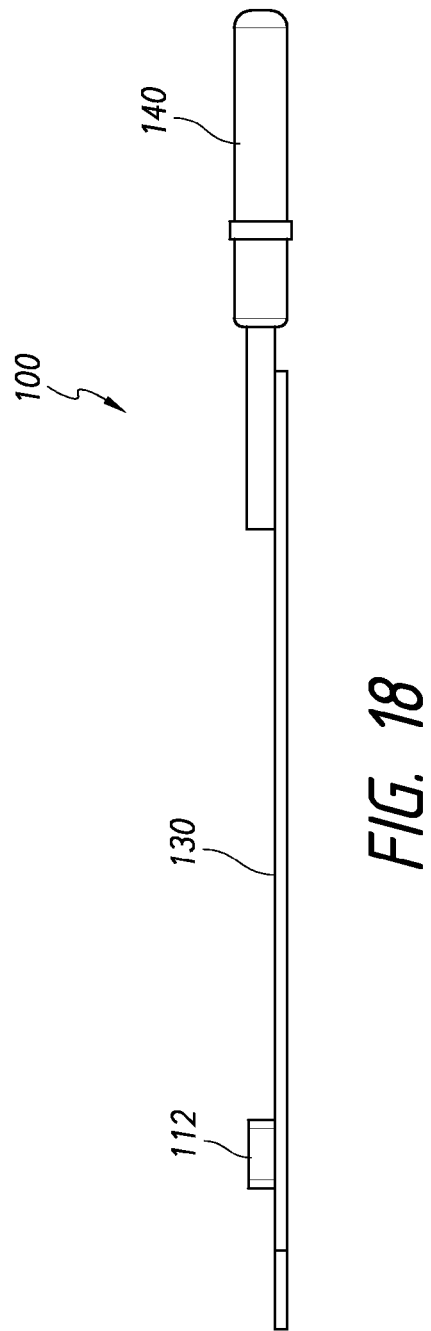

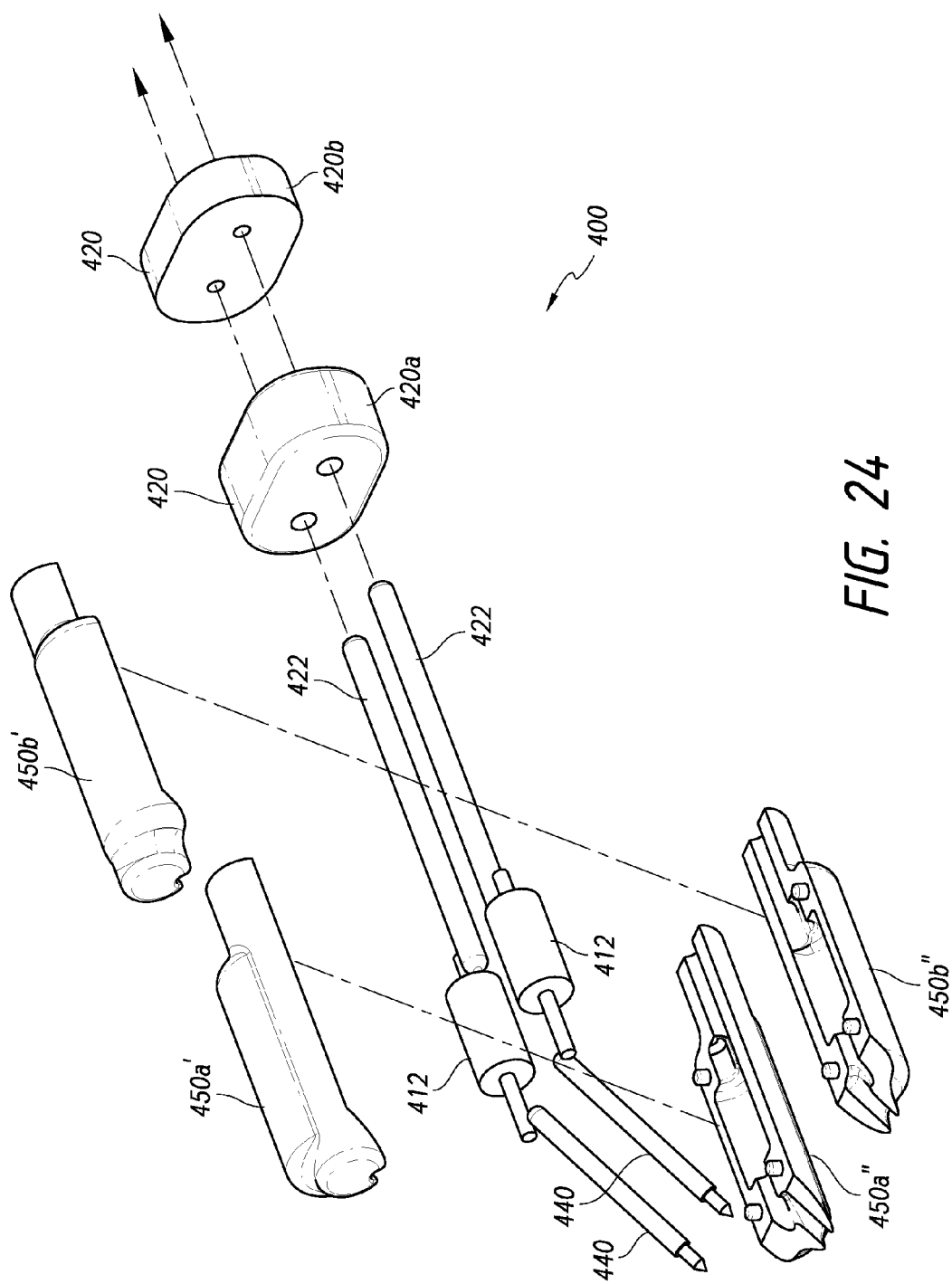

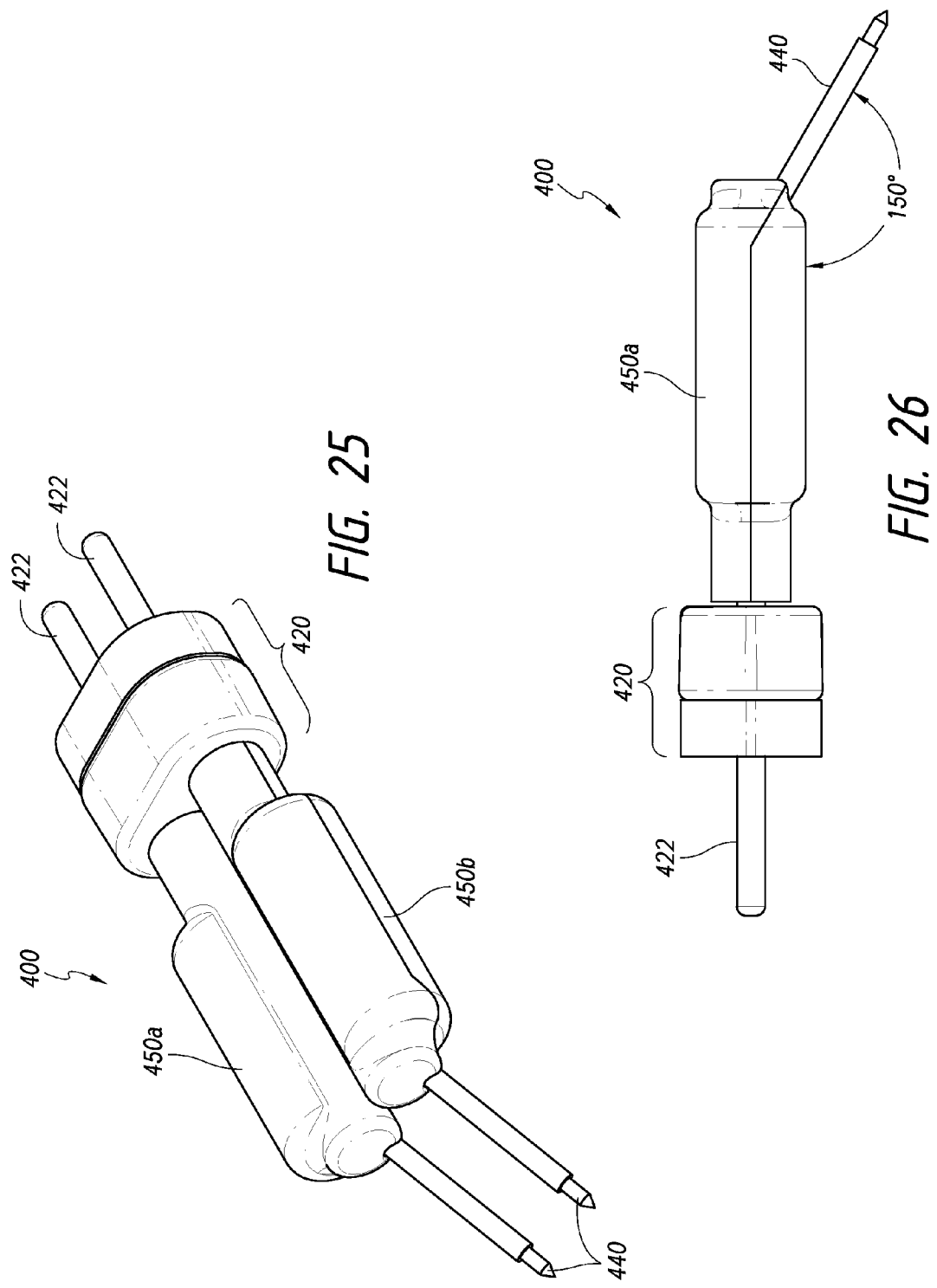

COMPENSATING RESISTANCE PROBING TIP OPTIMIZED ADAPTERS FOR USE WITH SPECIFIC ELECTRICAL TEST PROBES

The present application is an application claiming the benefit under 35 USC Section 119(e) of U.S. Provisional Application Ser. No. 61/437,635, filed Jan. 29, 2011. The present application is a continuation-in-part of U.S. patent application Ser. No. 12/715,269, filed Mar. 1, 2010, now U.S. Pat. No. 8,098,078. U.S. patent application Ser. No. 12/715,269 is a continuation of U.S. patent application Ser. No. 11/650,368, filed Jan. 5, 2007, now U.S. Pat. No. 7,671,613. U.S. patent application Ser. No. 11/650,368 is an application claiming the benefit under 35 USC Section 119(e) of U.S. Provisional Patent Application Ser. No. 60/757,077, filed Jan. 6, 2006. The present application is based on and claims priority from these applications, the disclosures of which are hereby expressly incorporated herein by reference.

BACKGROUND OF INVENTION

Disclosed herein are compensating resistance "probing tip" (electrical test probe tip) optimized adapters, and more particularly to compensating resistance electrical test probe tip optimized adapters having compensating resistance (or capacitance) in series or parallel with the transmission path, the compensating resistance probing tip adapters being optimized for use with specific electrical test probes.

A probing system generally includes an electrical test probe for providing an electrical connection between signal testing points of electrical components (e.g. integrated circuits) and testing instruments (e.g. oscilloscopes and other measuring, monitoring, diagnostic, and signal processing instruments). An electrical test probe generally includes a cable (or other transmission path) having a probing head at one end and a testing instrument connector at the other end. The probing head (via at least one probing tip) is for interacting with electrical components. The testing instrument connector is for attaching the cable to testing instruments.

The probing head generally is interconnectable with at least one "probing tip" (electrical test probe tip), which may be an integral probing tip, a removable probing tip, and/or a replaceable probing tip. A socket, spring contact, or other connection means may be used for connecting a removable and/or replaceable probing tip to the probing head. Many probing heads have mechanisms for connecting two probing tips (one of which may be for probing ground). Probing heads may have mechanisms for connecting to more than two probing tips.

Users purchase the electrical test probes based on the performance of the electrical test probes. Accordingly, electrical test probes are carefully designed and tested. Representations and warranties as to the performance of the electrical test probes are made by manufactures and vendors. These representations and warranties are based on how the electrical test probe performs up to a particular mechanical point of contact (a minimal configuration). No representations or warranties are made to the performance of the electrical test probes beyond that particular mechanical point of contact.

Probing tips may be used, for example, for making electrical contact with signal testing points (e.g. components through which an electrical signal is flowing, such as legs of an IC (integrated circuit), pins, leads, paths, or other electrical components) such as those found on a circuit board or other device under test (DUT). Signals may flow from the testing points through a transmission or input path (that extends substantially the length of the probing tip), through the probing head, through the cable, and to the testing instrument.

Probing tips may connect the probing head to signal testing points (also called probing points). Probing tips may also be used to connect the probing head to ground (a special type of probing point). Ground provides the electrical reference point for other signal measurements. In other words, the ground connection typically remains unchanged while the probing head is positioned at (or otherwise interacts with) other signal testing points, so that the electrical signal thereon may be measured, monitored, or otherwise processed. A user may use multiple probing tips for connecting to multiple signal testing points. For example, a user might want to connect to multiple signal testing points to compare signals thereon or to perform operations on signals thereon (e.g. summing operations, differential operations, or quantifying operations). Alternatively, a user may use one probing tip to connect to ground and another probing tip to connect to a signal testing point having an electrical signal thereon.

It is difficult to form a contact with modern miniaturized testing points. For example, both the pins and the spacing between the pins on a modern integrated circuit chip ("IC") have been miniaturized. When probing for electrical signals in tight spaces, engineers may need to connect two signal testing points simultaneously. This need may arise, for example, as a need to simultaneously connect to a signal testing point and a ground testing point. This need may also arise as a need to connect two signal lines (testing points) in a differential probing setting in an integrated circuit. Tight spaces other than those associated with an integrated circuit might also need to be probed. If two adjacent pins are contacted simultaneously by the probing tip, a short circuit may result between the two adjacent pins. A short circuit may prevent measurement of the desired signal and/or may result in damage to the internal circuitry of the integrated circuit.

In the integrated circuit context, both the signal probing tip and the ground probing tip need to be connected through the legs of the integrated circuit. The distances between the ground testing point and leg testing point to be probed, however, may be variable distances apart, and indeed may change as the desired leg to be probed changes. Thus, a user probing such an integrated circuit needs a flexible multi-spacing method that isolates one leg of such an integrated circuit. This one leg may be a ground or a signal leg. Importantly, when making contact with the legs of the integrated circuit, the probing tips must be electrically isolated from any other integrated circuit legs. If inadvertent electrical contact is made with another leg, a short circuit may result, or an improper reading is possible.

Many solutions to the variable distance problem require a plurality of adapters, each adapter designed for a different distance between integrated circuit legs being probed. This multiple adapter type of solution requires the user to carry extra adapters that can be easily lost. This type of solution also requires the user to remove and replace the adapters which is time consuming and troublesome. This multiple adapter type of solution can also mean that the user does not have the proper adapter. In short, this multiple adapter type of solution is fraught with problems.

BRIEF SUMMARY OF THE INVENTION

Disclosed herein in is a probing tip or conductive connector that is referred to generally as a "probing blade." Also disclosed herein are compensating resistance probing tip optimized adapters that are generally referred to as "compensating resistance adapters."

The disclosed probing blade is suitable for performing desired probing activities. For example, the probing blade of the present invention can be used to provide a stable ground for high frequency probing and integrated circuit leg probing. The probing blade can be used to connect with many different integrated circuit leg pitches and to span one to more than twenty integrated circuit legs.

A probing blade conductive connector of the present invention includes a flexible-deflectable extension having a probing end and a head connection end. A conductive transmission path extends between the probing end and the head connection end. A pogo-rotational-action pin is electrically connected to the transmission path at the head connection end of the flexible-deflectable extension. Preferably, the flexible-deflectable extension is flexibly-deflectably adjustable. Preferably, the pogo-rotational-action pin provides both longitudinal motion (LM) and rotational movement (RM) between the flexible-deflectable extension and a probing head.

In one preferred embodiment, the flexible-deflectable extension has a front surface (through which at least a portion of the transmission path is exposed and/or accessible) and a back surface that is electrically insulated.

In one preferred embodiment, the flexible-deflectable extension further includes a support layer and a covering layer. The transmission path is positioned between the support layer and the covering layer.

In one preferred embodiment, solder is associated with the transmission path at the probing end of the flexible-deflectable extension.

In one preferred embodiment, the pogo-rotational-action pin is interconnectable with a connection mechanism of a probing head of an electrical test probe.

A compensating resistance adapter described herein is used with an electrical test probe having a mechanical point of contact, the conductive connector adapter spanning the distance between the mechanical point of contact and at least one signal testing point. The compensating resistance adapter has at least one transmission path extending longitudinally therewith. Each transmission path has a probing end and a head connection end. At least one compensating network is positioned substantially near the probing end of the at least one transmission path, the at least one compensating network configured with (e.g. in parallel or in serial) the at least one transmission path. For preferred compensating resistance adapters, the at least one compensating network compensates for inductance caused by the conductive connector adapter. For preferred compensating resistance adapters, the at least one compensating network when used in combination with the electrical test probe is optimized to the signal testing point.

Exemplary preferred compensating resistance adapters include a probing blade adapter, a twisted pair adapter, a Y-lead adapter, and a swivel pogo tip pair adapter.

The at least one compensating network may include components such as at least one resister, at least one capacitor, a circuit, and a combination of the other components.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 17 is a front plan view of the first exemplary compensating resistance electrical test probe tip optimized adapter.

FIG. 18 is a side view of the first exemplary compensating resistance electrical test probe tip optimized adapter.

FIG. 24 is an expanded view of a fourth exemplary compensating resistance electrical test probe tip optimized adapter in which the compensating networks are configured with the transmission paths of a swivel pogo tip pair adapter.

FIG. 25 is a perspective view of the fourth exemplary compensating resistance electrical test probe tip optimized adapter.

FIG. 26 is a side view of the fourth exemplary compensating resistance electrical test probe tip optimized adapter.

DETAILED DESCRIPTION OF THE INVENTION

Figure 1:
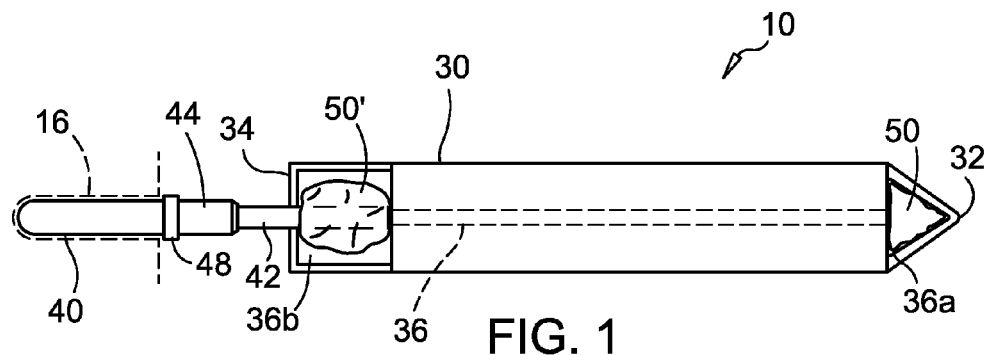
FIG. 1 is a front plan view of a first exemplary embodiment of a probing blade of the present invention having solder on its probing end.

Disclosed herein is a probing tip or conductive connector that is referred to generally as a "probing blade" (as shown in FIGS. 1-15). Also disclosed herein are compensating resistance probing tip optimized adapters that are generally referred to as "compensating resistance adapters" (as shown in FIGS. 16-29). As will be discussed below, the first exemplary compensating resistance adapter is a probing blade adapter.

Probing Blade

The present invention is directed to a probing tip or conductive connector that is referred to generally as a probing blade 10, exemplary embodiments of which are shown in detail in FIGS. 1-10. The probing blade 10 is particularly useful for use in one-handed probing of signal testing points 20 (also discussed as integrated circuit legs 20, legs L, or legs L1-Ln associated with at least one edge of an integrated circuit 22 having, for example, four edges).

As shown in FIGS. 11-15, when the probing blade 10 of the present invention is used in conjunction with a probing head 12 having at least one other probing tip 14 (which may be a probing blade 10), a user can make electrical contact with selective signal testing points 20 "regardless" of the distance therebetween (the maximum distance being limited only by the length of the probing blade 10). Further, a probing head 12 using the probing blade 10 of the present invention can be used between integrated circuit legs 20 "regardless" of any differences in pitch, size, quantity, or spacing of the integrated circuit legs 20 (the maximum distance being limited only by the length of the probing blade 10). This is accomplished without having to install an adapter. In preferred embodiments of the present invention, the probing blade 10 does not add distance to the input path, and provides a very short ground path when used in conjunction with an electrical test probe.

A probing head 12, used in conjunction with a probing blade 10 and a probing tip 14, can be used between a first integrated circuit leg L that contains a signal of interest and a second integrated circuit leg L that contains a signal of interest. Then, without disconnecting the probing blade 10 from the first integrated circuit leg L, the probing head 12 may be rotated so that the probing tip 14 is rotated to a third integrated circuit leg L that contains a signal of interest. This is possible even if the third integrated circuit leg L is on the opposite side of the edge of the integrated circuit 22 from the second integrated circuit leg L. Depending on the length of the probing blade 10, the characteristics of the integrated circuit (e.g. pitch, size, quantity, and/or spacing), and the location of the circuit legs, the second and third circuit legs may be on the same edge, parallel (opposite) edges, or perpendicular (adjacent) edges.

The probing blade 10 may be used with an electrical test probe (FIG. 11) for providing an electrical connection between testing points 20 (one of which may be ground) and a testing instrument. An electrical test probe generally consists of a probing head 12 (that may include at least one socket 16 or other means for attaching to the probing blade 10), a cable 18 (FIG. 11), and a testing instrument connector. At least one integral, removable, and/or replaceable probing blade 10 may be used in connection with the probing head 12. A removable and/or replaceable probing blade 10 would be connected to the probing head 12 using a socket 16, leaf spring, or other connection mechanism. The probing head 12 preferably includes active circuits, or alternatively, may be a passive probing head 12.

One preferred embodiment of the probing blade 10 of the present invention includes a flexible-deflectable extension 30 and a pogo-rotational-action pin 40. The flexible-deflectable extension 30 is flexibly-deflectably adjustable to provide a selective distance between two probing tips (the tips of the probing blade 10 and the probing tip 14) to span, for example, a plurality of integrated circuit legs L or other distances. Preferably, the pogo-rotational-action pin 40 is interconnectable (matable or integral) with a probing head 12 and provides both longitudinal motion (LM) and rotational movement (RM) between the flexible-deflectable extension 30 and the probing head 12.

Flexible-Deflectable Extension

The flexible-deflectable extension 30 is flexibly-deflectably adjustable to provide a selective distance between two probing tips (the tips of the probing blade 10 and the probing tip 14) to span many integrated circuit legs L, or other distances. This flexible-deflectable adjustability is accomplished because the flexible-deflectable extension 30 is able to change shapes with a small amount of force and substantially holds or maintains the shape as long as the force is applied consistently. In preferred embodiments, the shape is incidental in that the shape is a result of the force applied to move the probing head 12 and not as a goal itself. Further, the flexible-deflectable extension 30 substantially returns to its original shape, rather than holding the new shape when the force is removed (i.e. it is not shape retainable). For purposes of this invention, the flexible-deflectable extension 30 is not "floppy" in that it is able to temporarily hold its shape while force is being applied. For purposes of this invention, the flexible-deflectable extension 30 is not stiff in that it is able to change shape easily. Preferably, the flexible-deflectable extension 30 is hand flexible-deflectable such that no special tools are required for flexing-deflecting it. (The amount of force necessary for flexing-deflecting the flexible-deflectable extension 30 would be appropriate for its intended use of one-handed operation of a probing tip for probing electronic probing points.) The flexible-deflectable extension 30 may be loosely characterized as a cantilever-spring.

A flexible-deflectable extension 30 of the present invention preferably includes a probing end 32 suitable for probing and a head connection end 34 that connects (shown as an indirect connection through the pogo-rotational-action pin 40) to a probing head 12. A transmission path 36 extends between the probing end 32 and the head connection end 34. The probing end 32 may be, for example, shaped so that it can be selectively pinned, secured, or otherwise tightly fit between integrated circuit legs L to make selective electrical contact with a desired one of a plurality of integrated circuit legs L. In some preferred embodiments (FIGS. 1, 4-6, and 10), solder 50 is positioned on the probing end 32 of the flexible-deflectable extension 30. The head connection end 34 preferably has an attached pogo-rotational-action pin 40 that may be attached by solder 50'.

Figure 7:
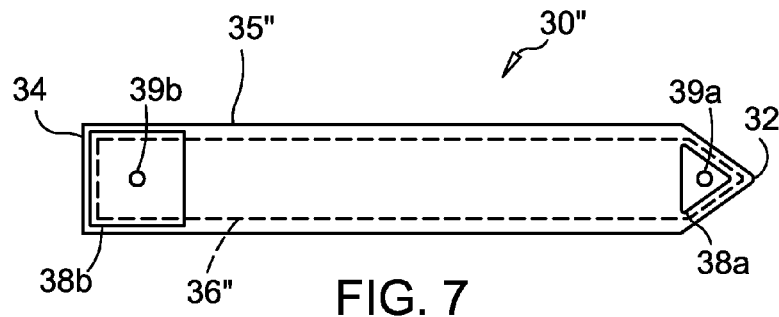
FIG. 7 is a front plan view of an alternative flexible-deflectable extension that could be used in a third exemplary embodiment of a probing blade of the present invention.
Figure 8:
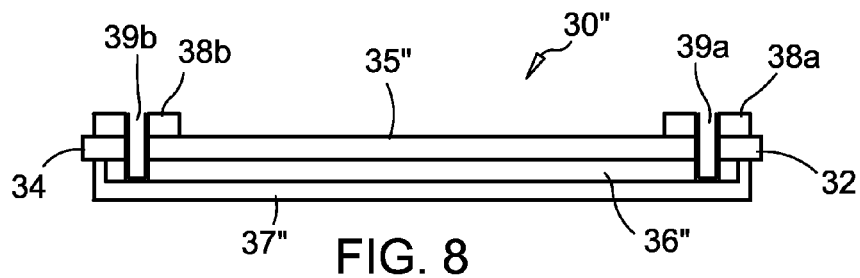
FIG. 8 is a cross-sectional side view of the alternative flexible-deflectable extension of FIG. 7.
Figure 9:
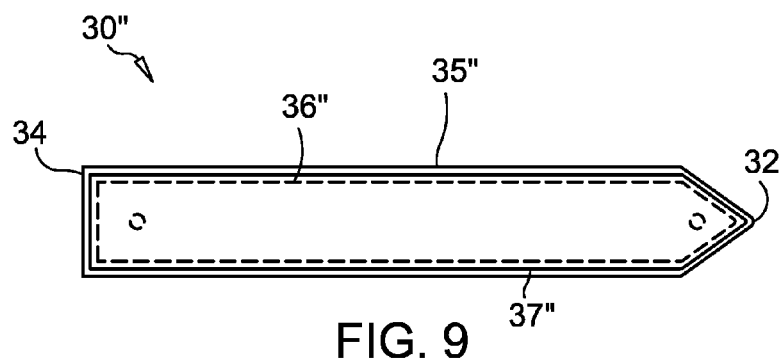
FIG. 9 is a back plan view of the alternative flexible-deflectable extension of FIG. 7.
Figure 10:
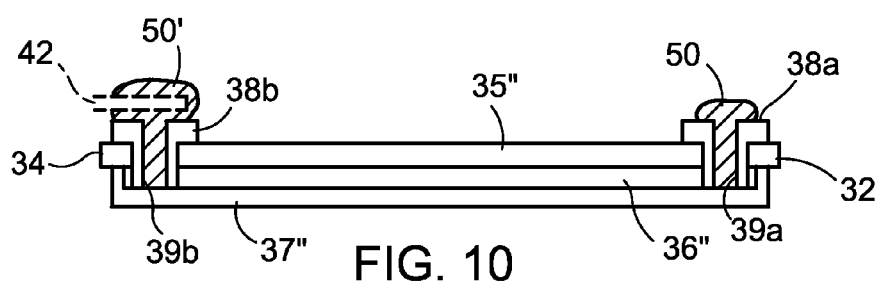
FIG. 10 is a cross-sectional side view of another alternative flexible-deflectable extension of FIG. 7 having solder on its probing end.

Significantly, only one surface (shown as a front surface) or face of the flexible-deflectable extension 30 allows for electrical access to the conductive transmission path 36. Preferably, the second, back (e.g. FIGS. 3 and 9), and/or other surface(s) are electrically insulated or covered such that the conductive transmission path 36 is not exposed. Electrical access may be accomplished, for example, by exposing at least part of the transmission path 36 as "pads" at either end. Electrical access may also be accomplished using alternative means such as through-holes. FIGS. 1-2 and 4-6 show one type of means for accessing the conductive transmission path 36 in which at least a portion of the conductive transmission path 36 is exposed on the surface. In this example, the front surface preferably has an exposed portion of the conductive transmission path 36 (e.g. "pad" 36a) at the probing end 32 and, in preferred embodiments, an exposed portion of the conductive transmission path 36 (e.g. "pad" 36b) at the head connection end 34. FIGS. 7, 8, and 10 show another type of means for accessing the conductive transmission path 36 using through-holes 39a, 39b in "pads" 38a, 38b. The through-holes 39a, 39b preferably have an interior surface that is conducting or transmission enhancing. It should be noted that other types of electrical paths may allow electrical access from the front surface to the conductive transmission path 36.

Figure 2:
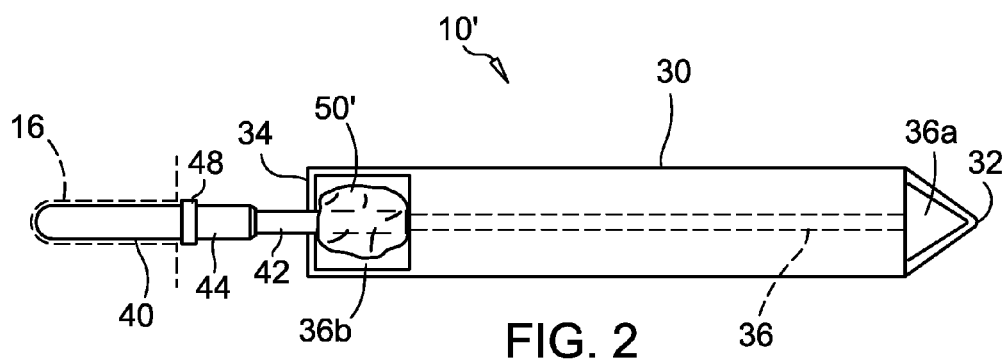
FIG. 2 is a front plan view of a second exemplary embodiment of a probing blade of the present invention without solder on its probing end.
Figure 3:
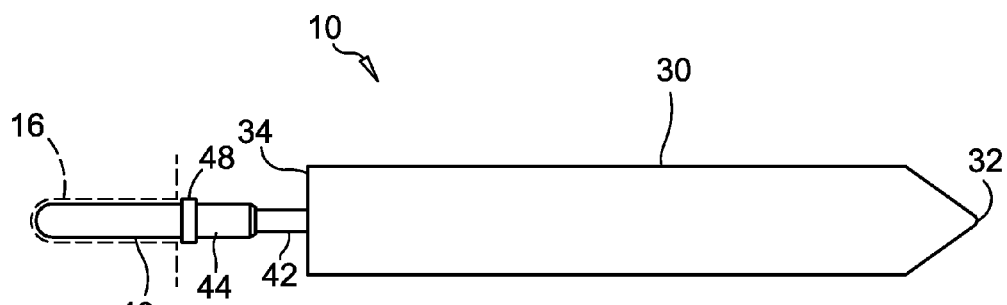
FIG. 3 is a back plan view of an exemplary embodiment of a probing blade of the present invention.

FIG. 1 shows the front surface of a first exemplary embodiment of a probing blade 10 of the present invention having solder 50 on its probing end 32. FIG. 2 shows the front surface of a second exemplary embodiment of a probing blade 10' of the present invention. The primary difference between the first embodiment probing blade 10 and the second embodiment probing blade 10' is that the first embodiment probing blade 10 has solder 50 on its probing end 32, whereas the second embodiment probing blade 10' does not. In both embodiments 10, 10' a transmission path 36 extends between the probing end 32 and the head connection end 34. It should be noted that the shown transmission path is meant to be exemplary and may have different characteristics (e.g. it may be wider or narrower than the path shown). FIG. 3 shows an exemplary back surface of either the first exemplary embodiment or the second exemplary embodiment.

Figure 4:
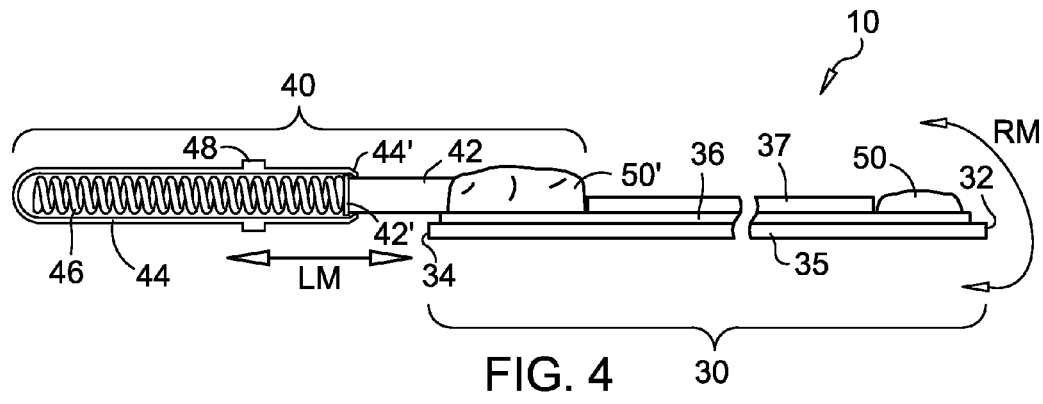
FIG. 4 is a partial side view of the first exemplary embodiment of a probing blade of the present invention, the pogo-rotational-action pin (shown in cross-section) being in an expanded state.
Figure 5:
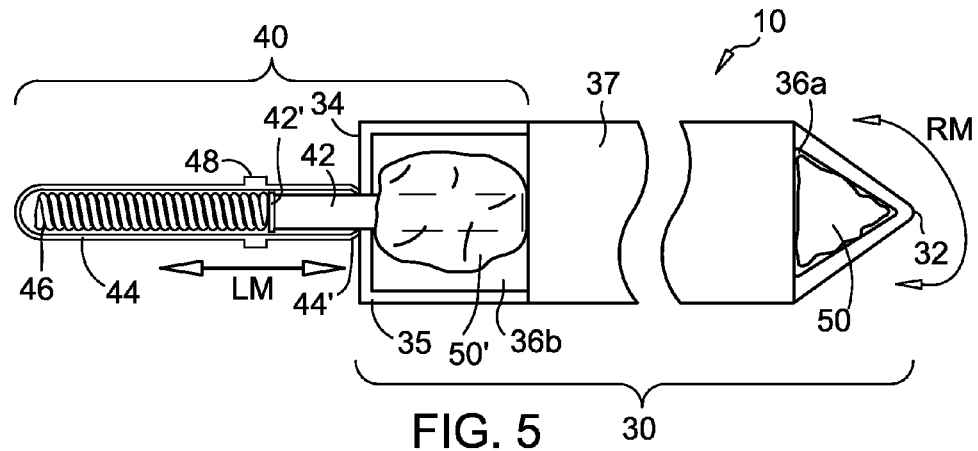
FIG. 5 is a partial front view of the first exemplary embodiment of a probing blade of the present invention, the pogo-rotational-action pin (shown in cross-section) being in a contracted state, and the flexible-deflectable extension being rotated 90° from the position of the flexible-deflectable extension shown in FIG. 4.

FIG. 4 shows an exemplary embodiment of the probing blade 10, 10' from the side. In this embodiment, the electrical or transmission path 36 (e.g. a conductive layer) is positioned between a support layer 35 (e.g. flex) and a covering layer 37 (e.g. a protective insulating layer). The layers (e.g. the transmission path 36, the support layer 35, and the covering layer 37) are preferably constructed as a flexible printed circuit board. The substantial "sandwiching" of the transmission path 36 between the support layer 35 and the non-conductive covering layer 37 helps to prevent unwanted electrical contact with the transmission path 36. As shown in FIG. 5, the transmission path 36 may have an enlarged "pad" 36a at the probing end 32 and an enlarged "pad" 36b at the head connection end 34. The enlarged "pads" 36a, 36b facilitate better and/or easier connections. One example of this is that the inner member 42 of the pogo-rotational-action pin 40 can easily be soldered or electrically connected to the enlarged "pad" 36b at the head connection end 34. Another example of this is that the enlarged "pad" 36a at the probing end 32 makes it easy to connect to signal testing points 20.

FIGS. 7-10 show an alternative exemplary embodiment of a flexible-deflectable extension 30" for the probing blade. In this alternative embodiment, although the electrical or transmission path 36" (e.g. a conductive layer) is positioned between a support layer 35" (e.g. flex) and a non-conductive covering layer 37" (e.g. a protective insulating layer), the positioning of these layers is different than the positioning of the layers shown in FIG. 4. Specifically, the support layer 35" is on the top and the non-conductive covering layer 37" is on the bottom. The substantial "sandwiching" of the transmission path 36" between the support layer 35" and the non-conductive covering layer 37" helps to prevent unwanted electrical contact with the transmission path 36". The layers (e.g. the transmission path 36", the support layer 35", and the non-conductive covering layer 37") are preferably constructed as a flexible printed circuit board. In this embodiment, an enlarged "pad" 38a (at the probing end 32) and an enlarged "pad" 38b (at the head connection end 34) are added to the top surface of the support layer 35". The enlarged "pads" 38a, 38b have at least one through-hole 39a, 39b (or void) defined therein that extends through the support layer 35" and (optionally) through the transmission path 36". Alternatively, the through-hole 39a, 39b could abut transmission path 36" or extend through only a part of the transmission path 36". The through-holes 39a, 39b preferably have a conducting or transmission enhancing layer or coating (e.g. metals such as copper or gold) on the interior surface thereof. The enlarged "pads" 38a, 38b and conducting through-holes 39a, 39b allow signal transmission from the top surface of the probing end 32, through the transmission path 36", and to the head connection end 34. It should be noted that the enlarged "pads" 38a, 38b and conducting through-holes 39a, 39b may be formed by rivet-like devices, layers, coatings, and/or a combination thereof. For example, FIG. 8 shows the enlarged "pads" 38a, 38b as a layer and the through-holes 39a, 39b having a coating (shown as a thicker line) thereon that covers inner peripheral surfaces of the layers 38a, 38b, and 36. FIG. 10 shows the enlarged "pads" 38a, 38b and the through-holes 39a, 39b being created using a rivet-like device or a unified layer/coating (e.g. one layer or coating that is both on the top surface of the flexible-deflectable extension 30" and in the through-holes 39a, 39b). FIG. 10 also shows solder 50, 50' in the through-holes 39a, 39b.

As mentioned, the substantial "sandwiching" of the transmission path 36 between the non-conductive support layer 35 and the non-conductive covering layer 37 helps to prevent unwanted electrical contact with the transmission path 36. The "pads" and solder at the probing end 32 are only on one side/face of the probing blade 10. Because only one face of the probing end 32 is conductive, only one probing point 20 will be probed when the probing end 32 is positioned, for example, between two legs L. However, the user may rotate the flexible-deflectable extension 30 on the pogo-rotational-action pin 40 by 180° to probe either adjacent leg. In the preferred embodiment, the pogo-rotational-action pin 40 allows rotation in either direction in a 360° circle.

In preferred embodiments, the electrical or transmission path may be made of any conductive and flexible material. Exemplary preferred transmission path materials include copper or gold. In preferred embodiments, the support layer may be made of any "sturdy," non-conductive, and flexible material. Exemplary preferred support layer materials include kapton, polyimide, Rogers R-Flex® (Rogers Corporation, Advanced Circuit Materials Division, Chandler, Ariz.), or Pyralux® (DuPont, Wilmington, Del.). In preferred embodiments, the covering layer may be made of any insulating, non-conductive, and flexible material. Exemplary preferred covering layer materials include insulative kapton.

It should be noted that the proportions shown in the drawings are not drawn to scale. For example, the through-holes 39a, 39b may be significantly smaller in proportion to that shown in FIGS. 7-10. The "pads" of the various embodiments may be enlarged or of a smaller size. Another example is that the thickness of the layers in FIGS. 4, 8, and 10 may be significantly thicker than the shown preferred embodiments of the present invention. The thicknesses of the layers shown in the drawing have been exaggerated for purposes of drawing clarity. An exemplary preferred embodiment of the present invention would have a flexible-deflectable extension that is ⅜ inches-⅝ inches in length. This exemplary flexible-deflectable extension would be between 0.004 inches and 0.015 inches in thickness including the transmission path, the support layer, and the covering layer. These dimensions are meant to be exemplary and are not meant to limit the scope of the invention.

In the shown embodiments, the probing end 32 is a flat triangular-shaped tip. The flat triangular-shaped tip is able to hold a stable contact for integrated circuit legs L. As shown, the flat triangular-shaped tip has at least two equal sides (isosceles), but the sides could be uneven. Also, although the flat triangular-shaped tip is shown as having an angle of approximately 40°-70°, larger and smaller angles could be used. The probing end 32 may have a more conventional sharp-tip shape and not a specialty flat triangular-shaped tip. Other alternative shapes could be constructed such as the tips described in U.S. Pat. No. 6,538,424 (Notched Electrical Test Probe Tip), U.S. Pat. No. 6,809,535 (Notched Electrical Test Probe Tip), U.S. Pat. No. 7,140,105 (Notched Electrical Test Probe Tip), U.S. Pat. No. 6,650,131 (Electrical Test Probe Wedge Tip), U.S. Pat. No. 6,518,780 (Electrical Test Probe Wedge Tip), U.S. Pat. No. D444,720 (Notched Electrical Test Probe Tip), and U.S. Pat. No. D444,401 (Electrical Test Probe Wedge Tip). These patents/applications are assigned to the assignee of the present invention and their specifications are incorporated herein by reference. Still other preferred embodiments could be hybrids. For example, one or more sides of the flat triangular-shaped tip may have a notch defined therein. Another example of a hybrid is that the flat triangular-shaped tip may be relatively thick so that it can be tapered in one or more planes.

For higher bandwidth fidelity of the electrical test probe, the overall length of the flexible probing blade 10 could be shortened, or alternatively a compensating circuit could be added in series with a grounded (signal) path (transmission path 36). The thickness of the flexible-deflectable extension 30 could be increased. It should also be noted that any desired electrical test probe holder, including a human hand, will work with the probing blade 10 of the present invention.

Pogo-Rotational-Action Pin

The pogo-rotational-action pin 40 (also referred to herein as a "pogo pin 40") of the present invention is a spring-loaded pin that allows for two types of motion: longitudinal (LM) and rotational (RM). This may be accomplished using the structure shown in FIGS. 4 and 5 that includes an inner member 42 (shown as a shaft, plunger, or pin) that is slideable and rotatable within an outer member 44 (shown as a sleeve). A spring 46 provides an outward force tending to push the inner member 42 outward so that the pogo-rotational-action pin 40 is in an extended position as shown in FIG. 4. FIG. 5 shows the pogo-rotational-action pin 40 in a retracted position. The pogo-rotational-action pin 40 is attached to the transmission path 36 at one end (e.g. at the enlarged "pad" 36b at the head connection end 34 of the flexible-deflectable extension 30 via solder 50') and to a socket 16 of a probing head 12 at a second end (see FIGS. 1-3). In such a position, it is part of the electrical path that facilitates the transmission of signals between testing points 20 and a testing instrument.

As shown in FIGS. 4 and 5, the pogo-rotational-action pin 40 includes an inner member 42 that is slideable and rotatable within an outer member 44. In one preferred embodiment, the inner member 42 includes a conductive base or contactor 42' that extends at least partially beyond the annular edge of the end of the inner member 42. Preferably the contactor 42' is disk shaped and has a diameter slightly larger than the diameter of the inner member 42. In one preferred embodiment, the outer member 44 includes an inward lip 44' that bends at least partially inward towards the longitudinal center axis of the outer member 44. Preferably the inward lip 44' bends inwards annularly along the open end of the outer member 44 that receives the inner member 42. A spring 46 is positioned within the outer member 44. One end of the spring 46 butts against (so that it cannot go further, but is not necessarily secured to the outer member) the outer member 44 and the other end of the spring 46 butts against the end of the inner member 42 (contactor 42') positioned within the outer member 44. The spring 46 provides an outward force tending to push the inner member 42 outward so that the pogo-rotational-action pin 40 is in an extended position as shown in FIG. 4. In the shown embodiment, the extension position is limited by the contactor 42' coming into contact with the inward lip 44'. FIG. 5 shows the pogo-rotational-action pin 40 in a retracted position. The retracted position occurs when the outward force of the spring 46 is overcome by external force (e.g. the pogo pin 40 is being pushed inward) and the inner member 42 slides into the outer member 44 and the spring 46 compacts or compresses. It should be noted that the pogo-rotational-action pin 40 should be conductive to allow signals to flow therethrough.

Figure 12:
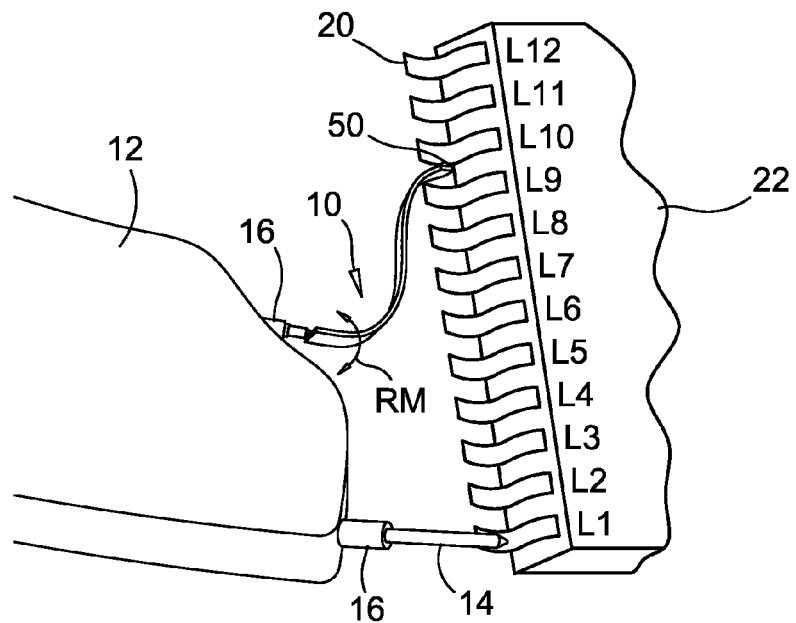
FIG. 12 is a perspective view of a probing blade of the present invention being used in a probing head to probe two signal testing points that are far apart (a far distance apart).
Figure 13:
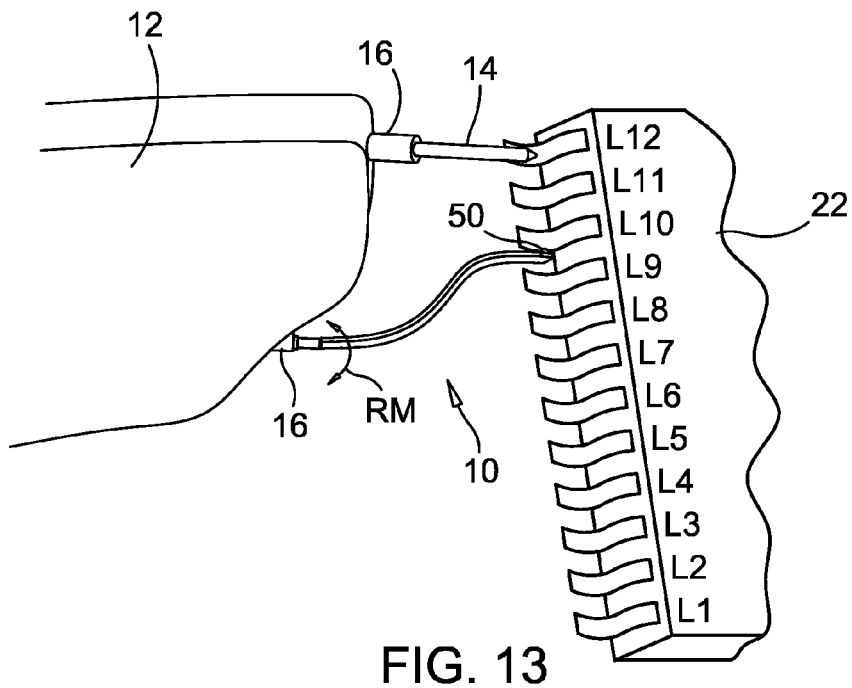
FIG. 13 is a perspective view of a probing blade of the present invention being used in a probing head to probe two signal testing points that are close together (a close distance apart).
Figure 14:
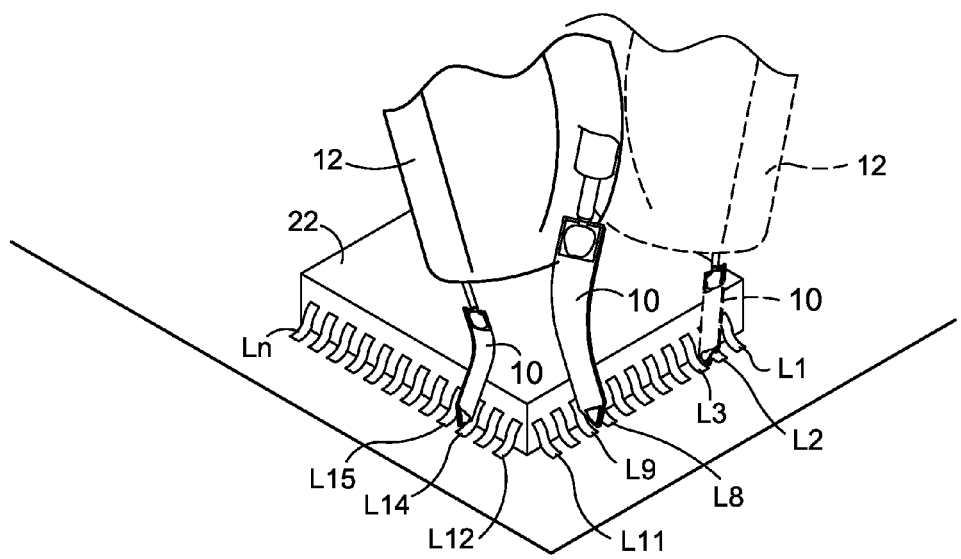
FIG. 14 is a perspective view of two probing blades of the present invention shown being used in a single probing head, the position of the probing head after rotational movement being shown in phantom.

The pogo-rotational-action pin 40 allows for two types of motion: longitudinal and rotational. The longitudinal motion (shown as dual directional arrow LM) is the traditional in/out motion of spring loaded pogo pins. The longitudinal motion is important because it provides a mechanism for variable force that translates to the probing end 32 that, in turn, interacts with the testing point with variable force. The rotational motion (shown as dual directional arrow RM) is important because it provides rotational positioning of the probing end 32. It is the rotational motion that allows a probing head 12 using the probing blade 10 to probe a first integrated circuit leg L and, without disconnecting, rotate between a second integrated circuit leg L on one side of the integrated circuit 22 and a third integrated circuit leg L on the opposite side of the first integrated circuit leg L. The two positions are shown in FIGS. 12 and 13. FIG. 14 shows the two positions on the same figure, one being in phantom.

Figure 6:
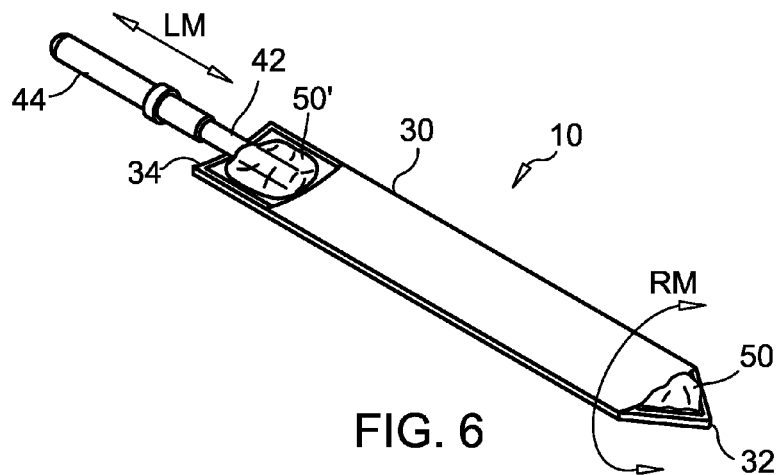
FIG. 6 is a perspective view of the exemplary embodiment shown in FIG. 1 showing rotational and linear movement.

FIGS. 4-6 show the longitudinal and rotational movement of a preferred exemplary embodiment of the pogo-rotational-action pin 40 in detail. FIG. 4 shows the pogo-rotational-action pin 40 in an expanded state and FIG. 5 shows the pogo-rotational-action pin 40 in a contracted state. The expanding and contracting of the pogo-rotational-action pin 40 is the longitudinal motion. FIG. 4 shows the flexible-deflectable extension 30 in first position and FIG. 5 shows the flexible-deflectable extension 30 in a second position, the second position being 90° from the first position. The pogo-rotational-action pin 40 allows for the rotational motion between the first position and the second position (or any other position in a 360° circle with the longitudinal axis of the pogo-rotational-action pin 40 being the center of the circle). It should be noted that the pogo-rotational-action pin 40 preferably can rotate 360° in its expanded state, its contracted state, and any state therebetween.

The pogo-rotational-action pin 40 may be integral or removable and/or replaceable. If the probing blade probing tip 10 is replaceable, generally the probing head 12 will have a socket 16 or other connection mechanism for mating with the probing blade 10. A shoulder/stop 48 may be provided on the annular exterior surface of the outer member 44 to provide an indication of a proper insertion depth of the pogo-rotational-action pin 40 within the socket 16. The shoulder/stop 48 may also be used as a grip for fingers, tweezers, and/or other tools.

Solder

Figure 15:
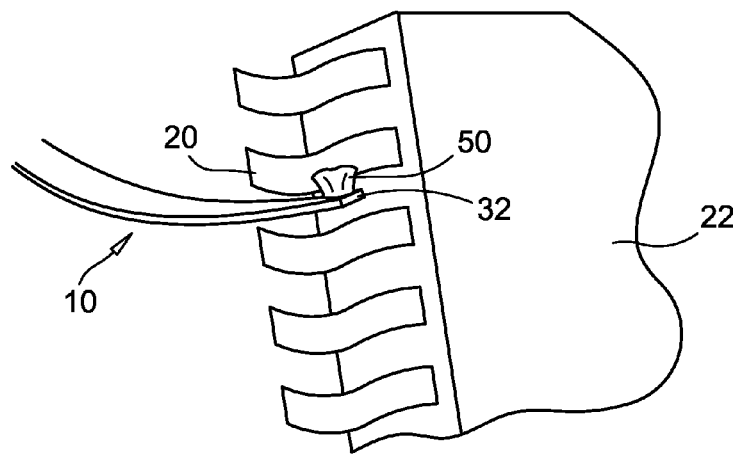
FIG. 15 is a perspective view of a probing end of a flexible-deflectable extension wedged between two integrated circuit legs, the solder being fused to the integrated circuit leg that is being probed.

Preferred exemplary embodiments of a probing blade 10 of the present invention may have solder 50 (shown as a solder bump) on its probing end 32. The solder 50 serves several purposes. First, the metal contact of the solder 50 may be pushed against an integrated circuit leg L or other testing point 20 having a signal of interest thereon. Second, the solder 50 may help prevent or reduce curling (e.g. the longitudinal edges of the flexible-deflectable extension 30 curling upwards and inwards) of the flexible-deflectable extension 30. FIG. 6 shows a slight curling that may be present even with the use of solder 50. Third, the solder 50 may act as a foot or other type of catch to help keep the probing end 32 properly wedged between two circuit legs L. Fourth, as shown in FIG. 15, it may be flowed (melted) to attach the probing end 32 to a circuit leg L to be probed.

It should be noted that the term "solder" is used in its general sense. Alternative electrical connection means including welding or silver epoxy may be used in place of the solder.

Probing Blade Examples

Figure 11:
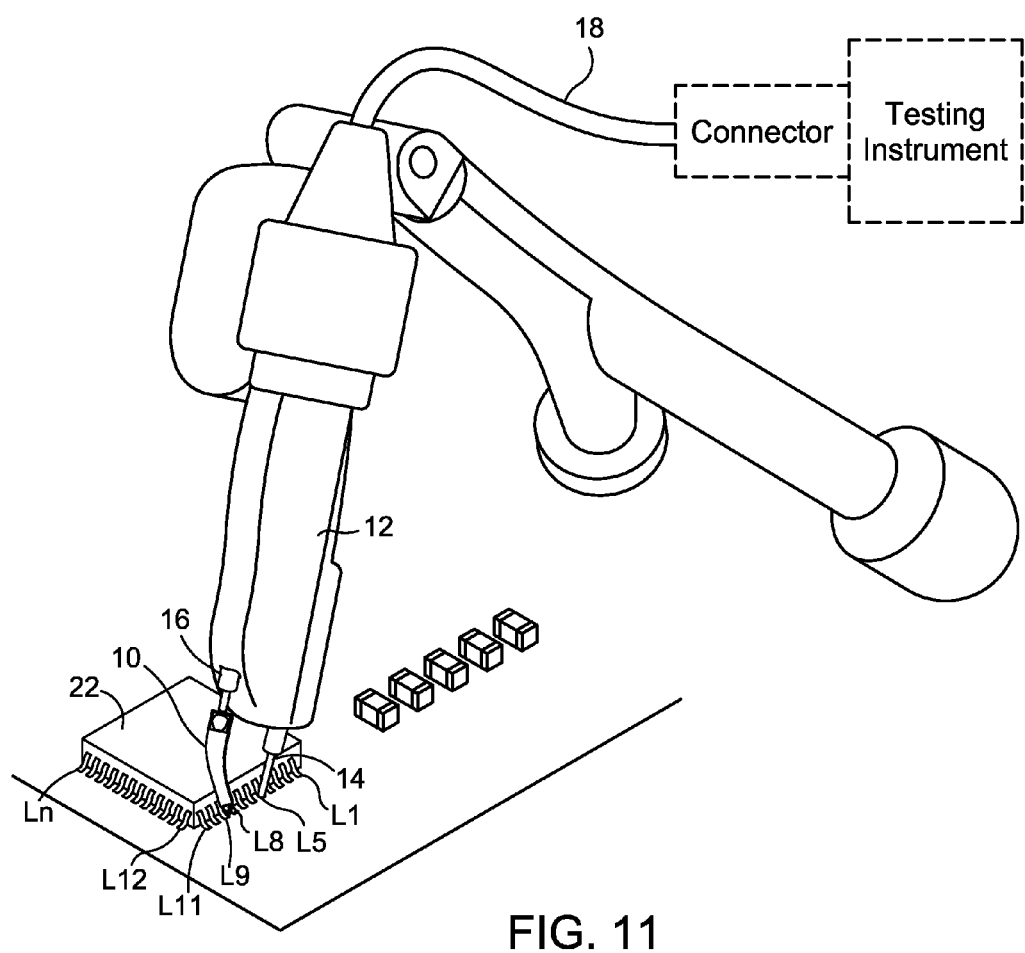
FIG. 11 is a perspective view of a probing blade of the present invention shown being used in a probing head supported by legs, the two signal testing points being a medium distance apart.

FIG. 11 shows a probing blade 10 of the present invention being used with a probing head 12 supported by legs for forming a tripod, the two signal testing points 20 being a medium distance apart. The legs may be those described in U.S. Pat. No. 6,462,529 (Legs For Forming A Tripod With An Electrical Test Probe), which is assigned to the assignee of the present invention and its specification is incorporated herein by reference. In this figure, the probing head 12 has both a probing blade 10 and a standard probing tip 14. The probing end 32 of the probing blade 10 is positioned between L8 and L9 and the second probing tip 14 is positioned on L5. Because only one face of the probing end 32 is conductive, only one probing point (L9) will be probed. The probing end 32 may include solder 50 that can be used to secure (for example, as a foot or soldered) the probing end 32 for probing. In this position, the pogo-rotational-action pin 40 has force being exerted on it so that the spring 46 is compressed and the pogo-rotational-action pin 40 is in a retracted position.

FIGS. 12 and 13 show a probing blade 10 of the present invention being used with a probing head 12 to probe two signal testing points 20 that are far apart (widely separated or a far distance apart) (FIG. 12) and two signal testing points 20 that are close together (a close distance apart) (FIG. 13). This shows the rotational motion (RM) feature of the present invention. In this embodiment, the probing end 32 of the probing blade 10 is positioned between L9 and L10. Because only one face of the probing end 32 is conductive, only one probing point (L10) will be probed. The probing end 32 may be soldered in place, hooked in place (using the solder as a foot), or held in place by friction (e.g. if the distance between legs is close). It is the rotational motion that allows a probing head 12 to use the second probing tip 14 to probe a first integrated circuit leg L1 (FIG. 12) and, without disconnecting, rotate so that the second probing tip 14 probes a second integrated circuit leg L12 (FIG. 13). In this example, L1 is on one side of the probing blade 10 (positioned between L9 and L10) and L12 is on the opposite side of the probing blade 10 (positioned between L9 and L10).

FIG. 14 shows a probing head 12 with two probing blades 10. This figure also shows two positions of the probing head 12 (one in phantom), again showing the rotational motion (RM) feature of the present invention. In this example, the probing head 12 is being used to probe two signal testing points 20 that are on opposite edges of an integrated circuit. As shown, the probing end 32 of the first probing blade 10 is positioned between L8 and L9. Because only one face of the probing end 32 is conductive, only one probing point (L9) will be probed. This probing end 32 may be soldered in place, hooked in place (using the solder as a foot), or held in place by friction (e.g. if the distance between legs is relatively small). In this figure, the second probing blade 10 probes a first integrated circuit leg L14 (solid) and, without disconnecting, rotates so that the second probing blade 10 probes a second integrated circuit leg L3 (in phantom). In this example, L14 is on one edge of the integrated circuit and L3 is on a different edge of the integrated circuit.

Method of Use of a Probing Blade

The present invention also includes a method for using the probing blade 10 of the present invention. In preferred embodiments of the method, the probing blade 10 is used in conjunction with a probing head 12 having at least one other probing tip 14 (that may be a probing blade 10). The probing head 12 can be used to make electrical contact with, for example, two signal testing points 20.

The first step of the method is to provide a probing blade 10 that has a flexible-deflectable extension 30 and a pogo-rotational-action pin 40. The flexible-deflectable extension 30 includes a probing end 32 (suitable for probing) and a head connection end 34 (suitable for connecting to a probing head 12—shown as an indirect connection through the pogo-rotational-action pin 40). FIGS. 1-10 show exemplary probing blades 10 in a substantially straight shape.

Next, as shown in FIGS. 11-15, a user positions the probing end 32 of a flexible-deflectable extension 30 between two integrated circuit legs L or other probing points 20. Alternatively, the probing end 32 may be positioned on top of, behind, against, hooked to, or otherwise in electrical contact with at least one probing point 20. If there is solder 50 on the probing end 32, it may then be flowed, melted, or otherwise electrically attached to the probing point 20 (as shown in FIG. 15).

The next step is to apply force to or otherwise create motion of the probing blade 10. The force may be rotational so as to create rotational motion (RM) so that a probing head 12 swivels in relation to the flexible-deflectable extension 30 using the pogo-rotational-action pin 40 as the pivot. The force may be longitudinal so as to create longitudinal motion (LM) so that the probing head 12 is pushed towards the probing point 20. A small amount of longitudinal force causes the pogo-rotational-action pin 40 to contract longitudinally (longitudinal motion (LM)) to create a better electrical connection. A larger amount of longitudinal force can cause the flexible-deflectable extension 30 to bend or bow. Force in other directions (e.g. diagonally, horizontally, rotationally) is absorbed by the bending of the flexible-deflectable extension 30. The force in other directions allows the probing head 12 to move in relation to the probing point 20. This would be important as the probing head 12 is moved so that the other probing tip 14 is used to probe a second probing point 20. Because the flexible-deflectable extension 30 is flexibly-deflectably adjustable, it is able to change shapes and hold the shape as long as the force remains, but substantially returns to its original shape, rather than holding the new shape when the force is removed.

A probing head 12, used in conjunction with a probing blade 10 and a probing tip 14, can be used between a first integrated circuit leg L that contains a signal of interest and a second integrated circuit leg L that contains a signal of interest. Then, without disconnecting the probing blade 10 from the first integrated circuit leg L, the probing head 12 may be rotated so that the probing tip 14 is rotated to a third integrated circuit leg L that contains a signal of interest. This is possible even if the third integrated circuit leg L is on the opposite side of the edge of the integrated circuit 22 from the second integrated circuit leg L. Depending on the length of the probing blade 10, the characteristics of the integrated circuit (e.g. pitch, size, quantity, and/or spacing), and the location of the circuit legs, the second and third circuit legs may be on the same edge, parallel (opposite) edges, or perpendicular (adjacent) edges.

Compensating Resistance Adapters

As set forth in the Background, users purchase electrical test probes based on the performance of the electrical test probes. Accordingly, electrical test probes are carefully designed and tested taking into consideration all the capacitance and resistance up to a mechanical point of contact (usually right near the amplifier). Representations and warranties as to the performance of the electrical test probes are made by manufactures and vendors. These representations and warranties are based on how the electrical test probe performs up to particular mechanical point of contact (a minimal configuration) shown as a socket 16 or a point of contact 16' of a probing head 12. No representations or warranties are made to the performance of the electrical test probes beyond that particular mechanical point of contact. In particular, no representations or warranties are made to the performance of the electrical test probes used in conjunction with conductive connector accessories, some of which are supplied along with the electrical test probes. The accessories span the distance from the mechanical point of contact 16' to a signal testing point 20. With the lower bandwidths of older electrical test probes, accessories did not significantly affect the performance of the electrical test probes. But as newer electrical test probes have higher bandwidths, adding accessories to electrical test probes significantly affects the performance of the combination and the representations become grossly inaccurate. Testing has shown that typical accessories can decrease the performance of an electrical test probe by approximately 75%-90% so that the combination of the electrical test probe and the accessory functions at approximately 25% of the performance of the electrical test probe alone.

Disclosed herein are conductive connectors accessories that will be referred to in general as compensating resistance "probing tips" (electrical test probe tips) optimized adapters or, more succinctly, "compensating resistance adapters" 100, 200, 300, 400 (or conductive connector adapters). The compensating resistance adapters have compensating resistance (or capacitance) that is configured with (in serial or parallel with) the transmission path that extends longitudinally with (e.g. inside of or along the surface of) the compensating resistance adapter. The resistance (or capacitance) is provided by resistance (or capacitance) devices referred to generally as "compensating networks" 112, 212, 312, 412. The compensating networks preferably include components such as resisters, capacitors, circuits (including active circuitry, amplifiers, etc.), a combination of components, and/or other compensating means known or yet to be discovered. Each compensating resistance adapters 100, 200, 300, 400 having a probing end and a head connection end. The compensating networks 112, 212, 312, 412 are preferably positioned substantially near (e.g. at or as near as possible to) the end of the compensating resistance adapters 100, 200, 300, 400 that are to contact the signal testing point 20 (the probing end). In this way, instead of only being optimized to the mechanical point of contact 16', the combination of the compensating resistance adapters 100, 200, 300, 400 and the electrical test probe is optimized for bandwidth performance all the way to the signal testing point 20. Testing has shown that when a compensating resistance adapter (such as one of those disclosed herein) replaces a structurally similar accessory in combination with an electrical test probe, the performance increases from peaking at 200 megahertz (with the typical accessory) to peaking at a gigahertz (with the compensating resistance adapter). The result is that the accessories that have compensation will perform at significantly higher frequencies and have greatly increased probe loading capabilities as compared to accessories that do not have compensation.

Exactly which component(s) are in the compensating networks 112, 212, 312, 412 is determined by the inductance and other parasitics for which the compensating network is compensating. A primary consideration in selecting the component(s) in the compensating network the inductance caused by accessory (which will be affected by the length and materials of the accessory). A secondary consideration will be the electrical test probe itself. Preferred compensating resistance adapters 100, 200, 300, 400 will have compensating networks 112, 212, 312, 412 that are optimized to compensate for use with specific types of electrical test probes (e.g. a particular manufacturer, model, and/or series). Other considerations include, but are not limited to, the intended device under test (DUT), the intended bandwidth, intended load, and other factors that can create inductance. Some alternative preferred compensating resistance adapters 100, 200, 300, 400 can be optimized to not only compensate for use with a specific type of electrical test probe, but are optimized individually to compensate for use with a specific electrical test probe. This individual optimization would generally be accomplished at the factory where the individual electrical test probe and the accessory (or accessories) can be optimized together. Some alternative preferred compensating resistance adapters 100, 200, 300, 400 can be adaptably optimized "in the field" by including changeable, tunable, and/or replaceable compensating networks 112, 212, 312, 412.

Probing Blade Adapter

Figure 16:
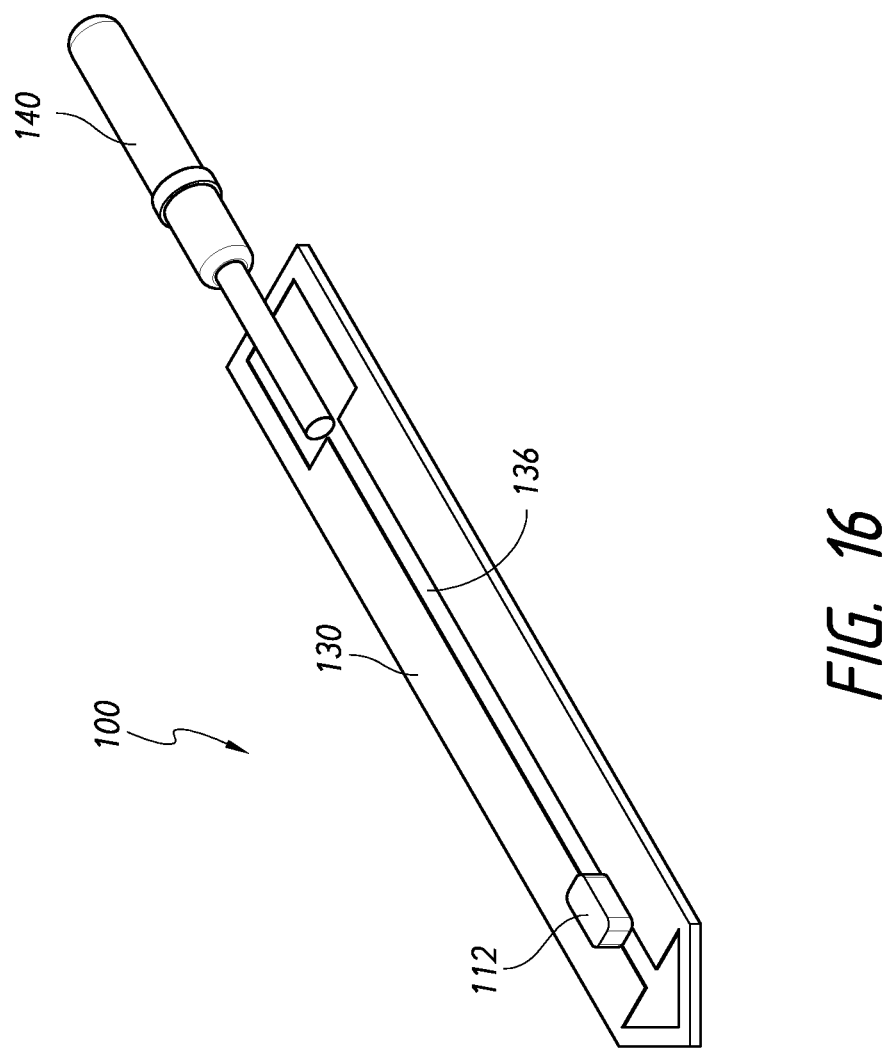
FIG. 16 is a perspective view of a first exemplary compensating resistance electrical test probe tip optimized adapter in which the compensating network is configured with the transmission path of a probing blade adapter.

As shown in FIGS. 16-18, the first exemplary compensating resistance adapter is a probing blade adapter 100 that is particularly useful for connecting to and/or probing IC leads.

One preferred embodiment of the probing blade adapter 100 of the present invention includes a flexible-deflectable extension 130 (having a transmission path 136) and a pogo-rotational-action pin 140. The flexible-deflectable extension 130 is flexibly-deflectably adjustable to provide a selective distance between two probing tips. Preferably, the pogo-rotational-action pin 140 is interconnectable (matable or integral) with a probing head and provides both longitudinal motion (LM) and rotational movement (RM) between the flexible-deflectable extension 130 and the probing head. Additional features and/or information of preferred probing blade adapters 100 are incorporated herein from the description on the probing blade 10 described herein and in the applications from which this application claims priority.

The probing blade adapter 100, however, includes a compensating network 112 in serial or in parallel with the transmission path 136. The compensating network 112 is shown as a 20 ohm resistor ±1% that is soldered to the transmission path 136. The compensating network 112 may include components such as resisters, capacitors, circuits, a combination of components, and/or other compensating means known or yet to be discovered. The compensating network 112 is preferably positioned at (or as near as possible to) the end of the transmission path 136 of the probing blade adapter 100 that is to contact the signal testing point 20 (the probing end). In this way, instead of only being optimized to the mechanical point of contact 16', the combination of the probing blade adapter 100 and the electrical test probe is optimized for bandwidth performance all the way to the signal testing point 20.

Twisted Pair Adapter

Figure 19:
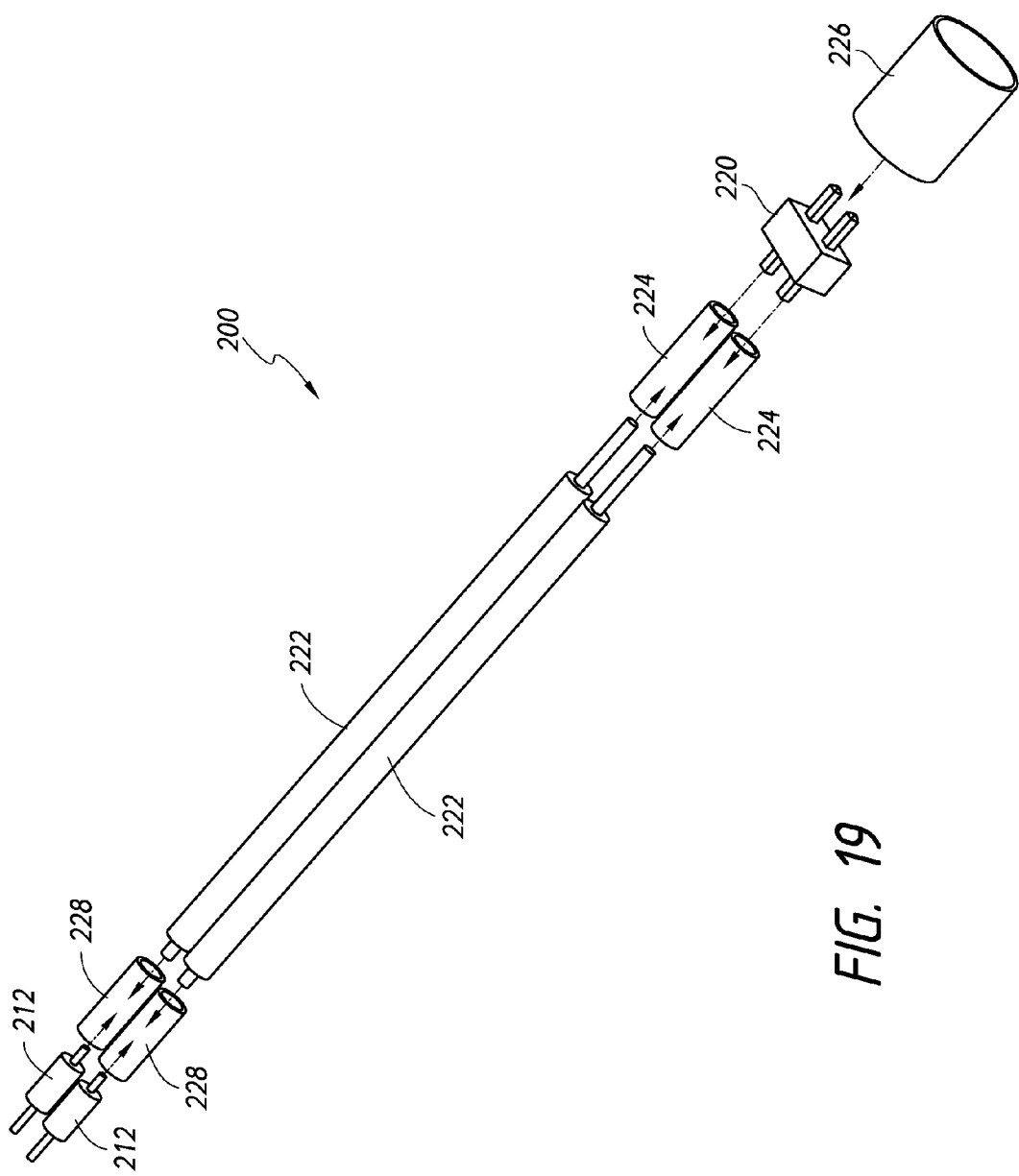
FIG. 19 is an expanded view of a second exemplary compensating resistance electrical test probe tip optimized adapter in which the compensating networks are configured with the transmission paths of a twisted pair adapter.
Figure 20:
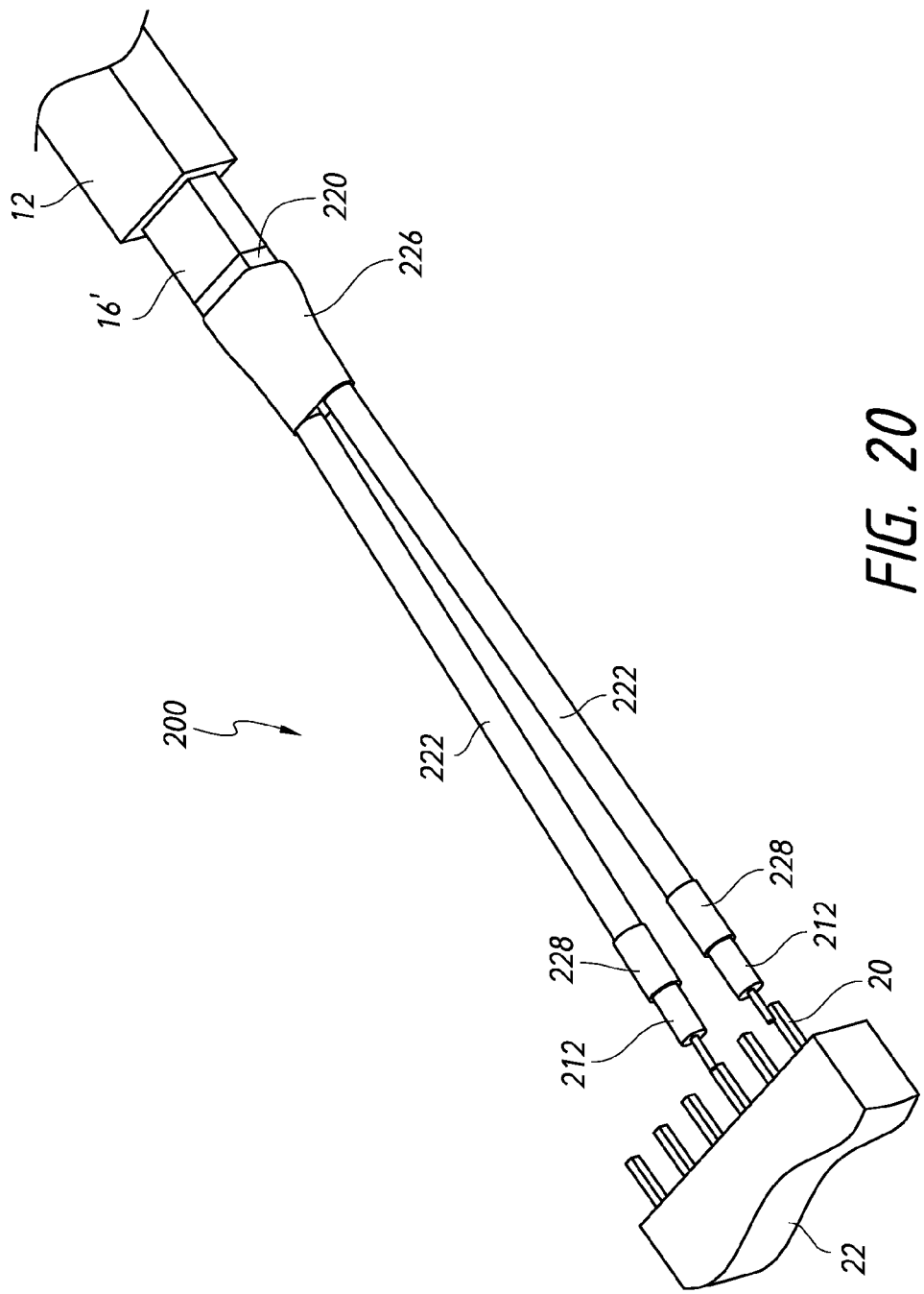
FIG. 20 is a perspective view of the second exemplary compensating resistance electrical test probe tip optimized adapter probing two signal testing points.

As shown in FIGS. 19-20, the second exemplary compensating resistance adapter is a twisted pair adapter 200.

One preferred embodiment of the twisted pair adapter 200 of the present invention includes at least one transmission path that, starting from the probing head 12 and mechanical point of contact 16', includes (from the head connection end to the probing end) a square pin pair 220, a pair of wires 222 (shown as insulated stranded wires), and the compensating network 212. The elements of the transmission path associated such that they form the at least one transmission path. In the shown twisted pair adapter 200, each pin of the square pin pair 220 is attached to a respective stripped end (a first end) of one of the wires 222. In the shown configuration, each pin of the square pin pair 220 is attached to and held in place with the stripped end of the wires 222. Thin walled, adhesive lined heat shrink 224 may be used to accomplish the attaching and/or holding of the pin(s) of the square pin pair 220 to/with the stripped end of the wires 222. A larger thin walled heat shrink 226 may be used for additional attaching, holding, and/or protection. Each opposite stripped end (a second end) of the pair of wires 222 (opposite from the end attached to the square pin pair 220) is attached to a respective one of the compensating networks 212. In the shown configuration, each opposite end of the wires 222 is attached to and held in place with a respective compensating network 212. Thin walled, adhesive lined heat shrink 228 may be used to accomplish the attaching and/or holding of the compensating network(s) 212 to/with the opposite stripped end of the wires 222. In the shown configuration, the compensating network 212 slightly protrudes from the heat shrink 228. The shown resulting configuration is a V-shaped adapter with the square pin pair 220 at the bottom joined end of the "V" and the compensating networks 212 at the upper ends of the "V."

The compensating network 212 (which includes both shown compensating networks 212) of the twisted pair adapter 200 is a miniature leaded resistor (shown as a 54 ohm resistor ±1%). The compensating network 212 may include components such as resisters, capacitors, circuits, a combination of components, and/or other compensating means known or yet to be discovered. The compensating network 212 is preferably positioned at (or as near as possible to) the ends of the twisted pair adapter 200 that is to contact the signal testing point 20. In this way, instead of only being optimized to the mechanical point of contact 16', the combination of the twisted pair adapter 200 and the electrical test probe is optimized for bandwidth performance all the way to the signal testing point 20.

Y-Lead Adapter

Figure 21:
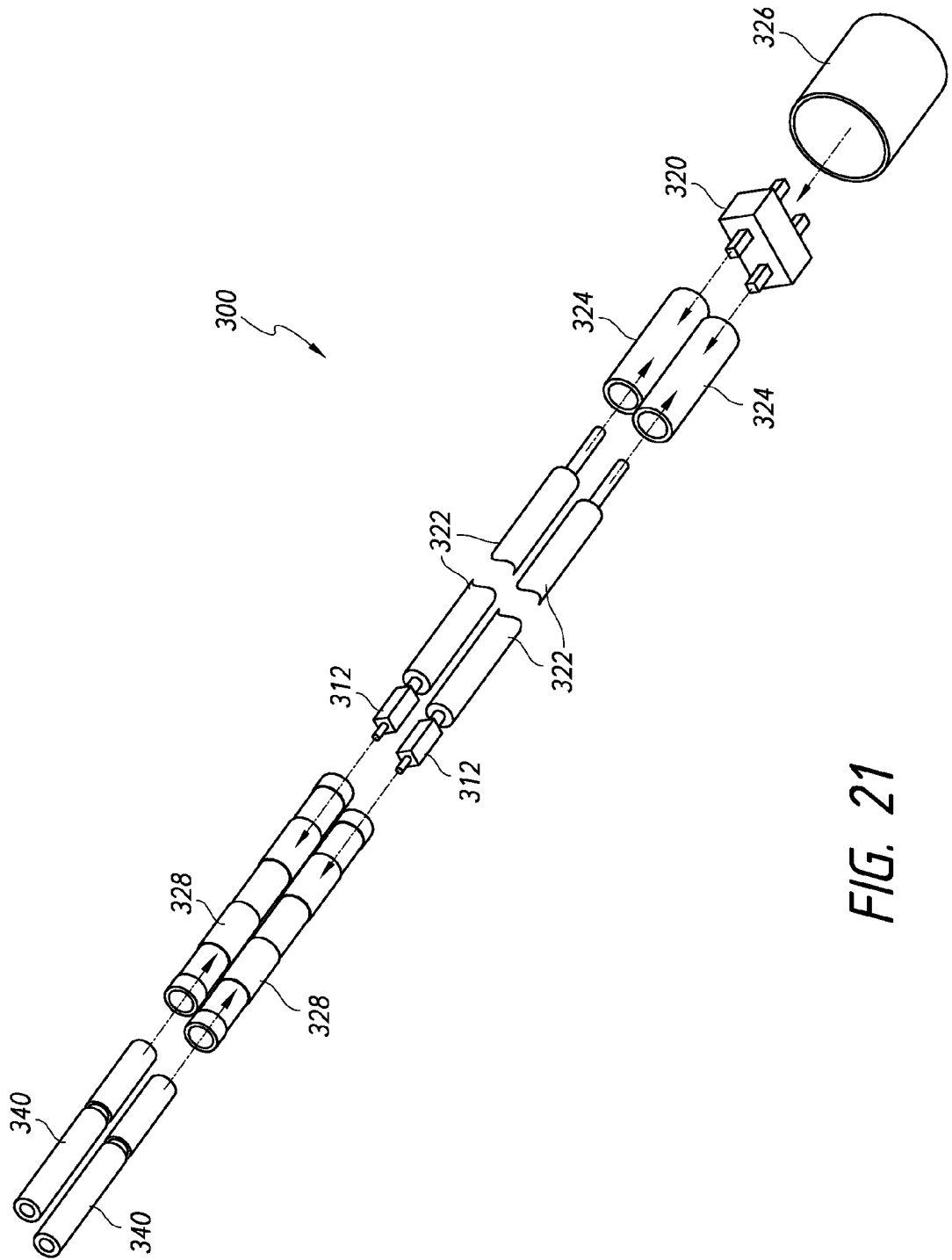
FIG. 21 is an expanded view of a third exemplary compensating resistance electrical test probe tip optimized adapter in which the compensating networks are configured with the transmission paths of a Y-lead adapter.
Figure 22:
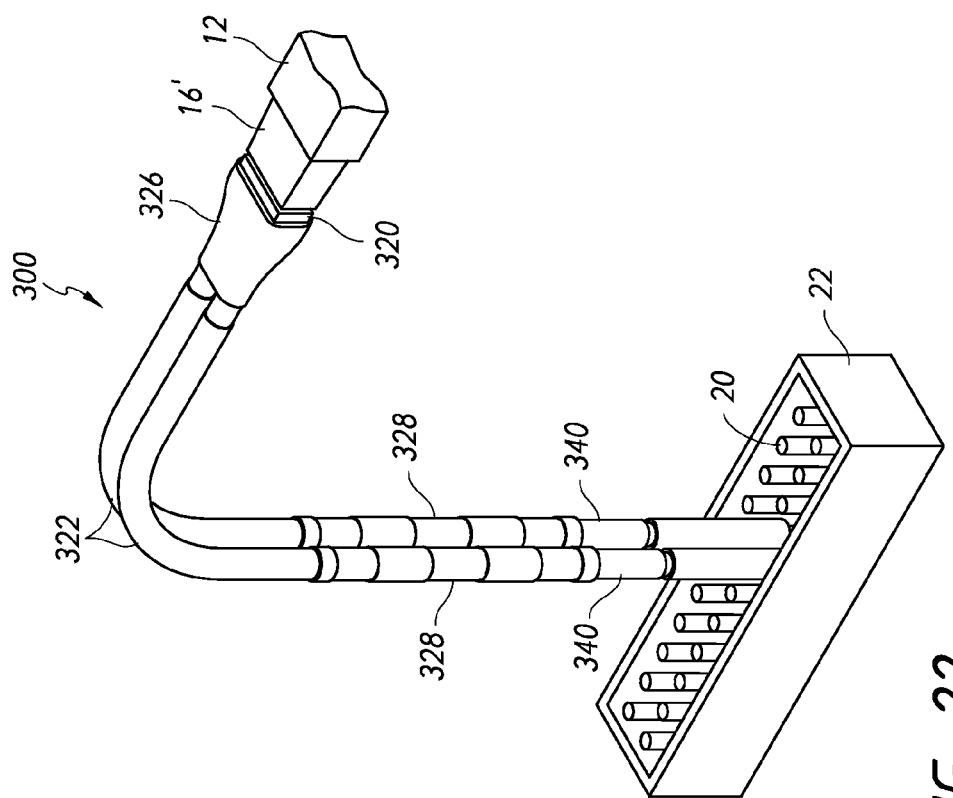
FIG. 22 is a perspective view of the third exemplary compensating resistance electrical test probe tip optimized adapter probing two signal testing points.
Figure 23:
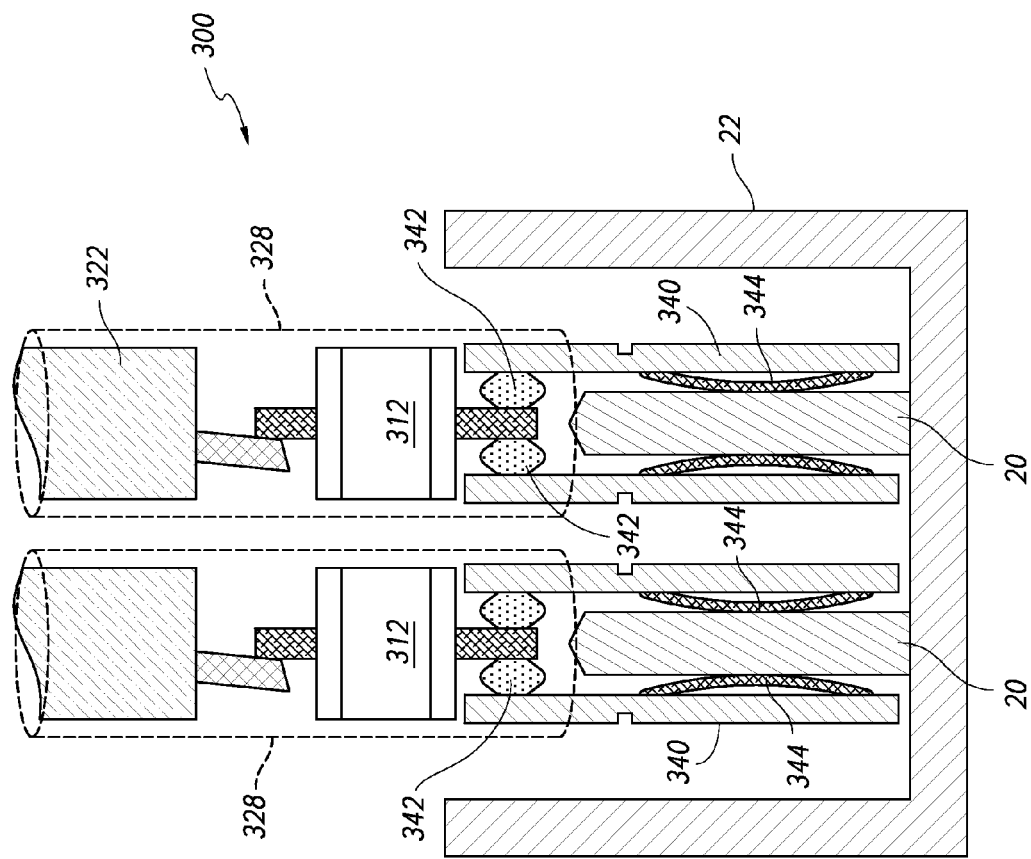
FIG. 23 is a cross-sectional view of the third exemplary compensating resistance electrical test probe tip optimized adapter probing two signal testing points.

As shown in FIGS. 21-23, the third exemplary compensating resistance adapter is a Y-lead adapter 300 that is particularly useful for connecting with and/or probing square pins.

One preferred embodiment of the Y-lead adapter 300 of the present invention includes at least one transmission path that, starting from the probing head 12 and mechanical point of contact 16', includes (from the head connection end to the probing end) a square pin pair 320, a pair of wires 322 (shown as insulated stranded wires), the compensating network 312, and a square pin socket 340. The elements of the transmission path associated such that they form the at least one transmission path. In the shown Y-lead adapter 300, each pin of the square pin pair 320 is attached to a respective stripped end (a first end) of one of the wires 322. In the shown configuration, each pin 320 is attached to and held in place with the stripped end 322. Thin walled, adhesive lined heat shrink 324 may be used to accomplish the attaching and/or holding. A larger thin walled heat shrink 326 may be used for additional attaching, holding, and/or protection. Each opposite stripped end (a second end) of the pair of wires 322 (opposite from the end attached to the square pin pair 320) is attached to a respective one of the compensating networks 312 (at a first end of the compensating network 312). In the shown configuration, each opposite end 322 is attached to and held in place with (and may be soldered to) a respective compensating network 312 which, in turn, is attached (at a second end of the compensating network 312) to and held in place with the square pin socket 340. As shown in FIG. 23, a solder sleeve 328 may be used to enclose (which may include attaching and/or holding) an opposite end 322, a compensating network 312, and one end of a square pin socket 340. A thin walled, adhesive lined heat shrink may be used in place of the shown solder sleeve 328. In the shown configuration, the compensating network 312 is completely enclosed within the solder sleeve 328. FIG. 23 also shows that a lead of each compensating network 312 may be soldered 342 to the inside surface of the square pin socket 340. The shown resulting configuration is a V-shaped adapter with the square pin pair 320 at the bottom joined end of the "V" and the square pin sockets 340 at the upper ends of the "V." FIG. 23 shows the inner springs 344 of the square pin socket 340 gripping the exterior surfaces of the signal testing points 20.

The compensating network 312 (which includes both shown compensating networks 312) of the Y-lead adapter 300 is a miniature leaded resistor (shown as a 54 ohm resistor ±1%). The compensating network 312 may include components such as resisters, capacitors, circuits, a combination of components, and/or other compensating means known or yet to be discovered. The compensating network 312 is preferably positioned at (or as near as possible to) the ends of the Y-lead adapter 300 that is to contact the signal testing point 20. In this way, instead of only being optimized to the mechanical point of contact 16', the combination of the Y-lead adapter 300 and the electrical test probe is optimized for bandwidth performance all the way to the signal testing point 20.

Swivel Pogo Tip Pair Adapter

Figure 27:
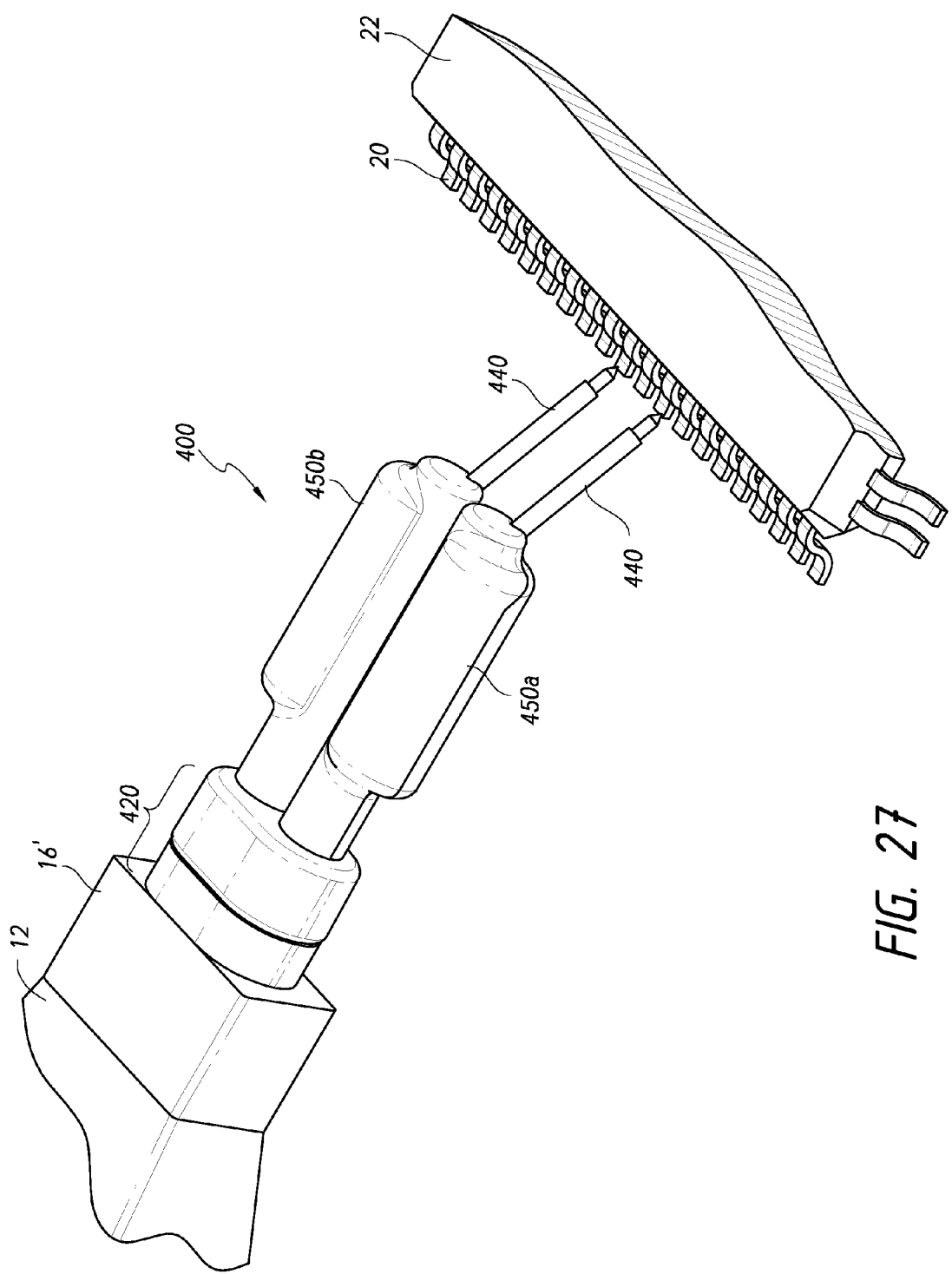
FIG. 27 is a perspective view of the fourth exemplary compensating resistance electrical test probe tip optimized adapter probing two signal testing points, the two signal testing points being a medium distance apart.
Figure 28:
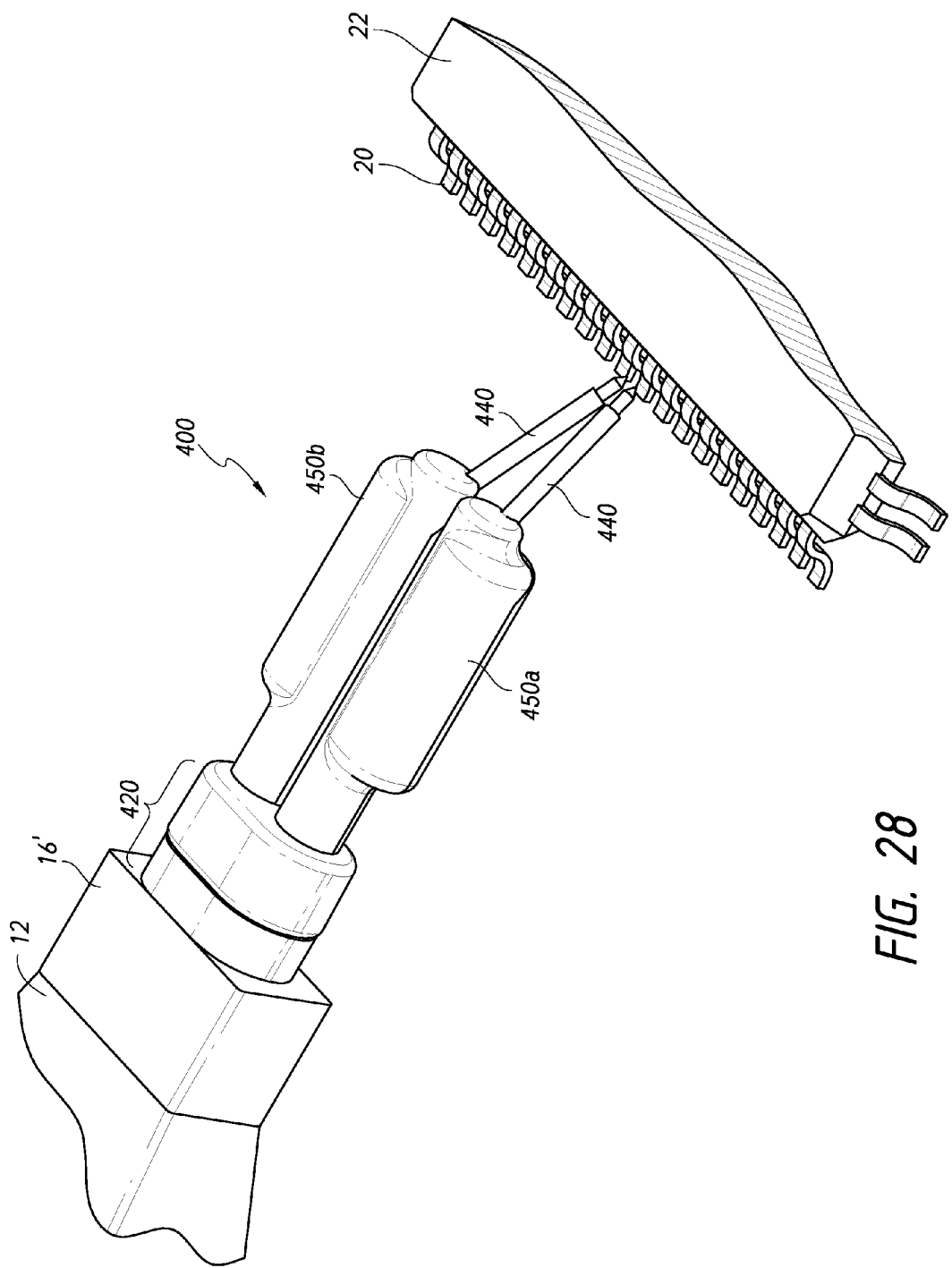
FIG. 28 is a perspective view of the fourth exemplary compensating resistance electrical test probe tip optimized adapter probing two signal testing points, the two signal testing points being a relatively small distance apart.
Figure 29:
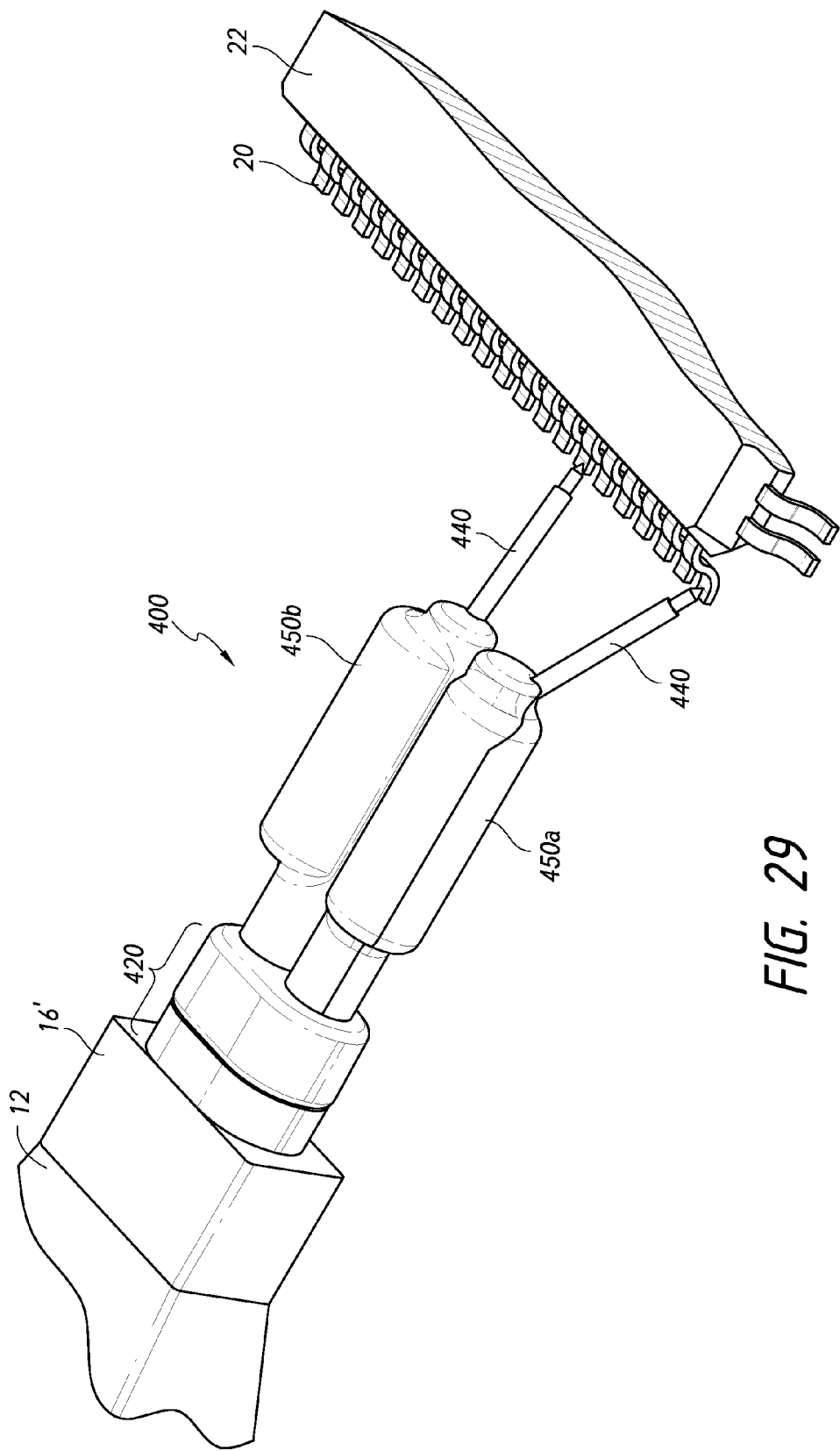
FIG. 29 is a perspective view of the fourth exemplary compensating resistance electrical test probe tip optimized adapter probing two signal testing points, the two signal testing points being a relatively large distance apart.

As shown in FIGS. 24-29, the fourth exemplary compensating resistance adapter is a swivel pogo tip pair adapter 400 (also referred to as a spin browser tip adapter 400). The swivel pogo tip pair adapter is particularly adapted to pairs of even and uneven contact points (e.g. vias, through hole pins, and ceramic resistors and capacitors). In addition to x-axis compliance and y-axis compliance, the swivel pogo tip pair adapter 400 also has z-axis compliance. The shown swivel pogo tip pair adapter can have spacing ranging from 0.00" to approximately 0.300". FIG. 27 shows the swivel pogo tip pair adapter 400 being used to probe two signal testing points 20 that are a medium distance apart. FIG. 28 shows the swivel pogo tip pair adapter 400 being used to probe two signal testing points 20 that are a relatively small distance apart. FIG. 29 shows the swivel pogo tip pair adapter 400 being used to probe two signal testing points 20 that are a relatively large distance apart.

One preferred embodiment of the swivel pogo tip pair adapter 400 of the present invention includes at least one transmission path that, starting from the probing head 12 and mechanical point of contact 16', includes (from the head connection end to the probing end) two straight pins 422, the compensating network 412, and a pair of pogo pins 440 (that may be a pogo-rotational-action pin 40 or it may be a standard pogo pin). The elements of the transmission path associated such that they form the transmission path. In the shown swivel pogo tip pair adapter 400, one end of the straight pins 422 are held together by a pivot fitting 420a and an interference fitting 420b (referred to jointly as the pivot interference fitting 420). The pivot fitting 420a may be a plastic or polycarbonate part having two apertures defined therein. The interference fitting 420b may be a rubber or foam part having two apertures defined therein that provides rotational resistance (functioning as a friction gasket). The apertures of the pivot fitting 420a and the interference fitting 420b are aligned to form two paths through which the two straight pins 422 are inserted (one through each aperture path). Once positioned through the aperture paths, the straight pins 422 are able to rotate with minimal effort (a user can easily rotate the pins using his fingers), but because of the rotational resistance the straight pins 422 do not spin loosely. Each opposite end (second end) of the pair of straight pins 422 (opposite from the end inserted through the pivot interference fitting 420) is attached to a respective one of the compensating networks 412. In the shown configuration, each opposite end 422 is attached to and held in place with a first end of a respective compensating network 412 (shown as a leaded resistor) using solder or other known methods. The other (second) end of the compensating network 412 is attached to and held in place with an associated pogo pin 440 using solder or other known methods. As shown, the pogo pin 440 is attached at an angle (shown as 150°) to the straight pin 422 and the compensating network 412. External housings 450a and 450b are formed from upper housing parts (450a' and 450b') and lower housing parts (450a" and 450b"). The upper housing parts (450a' and 450b') and lower housing parts (450a" and 450b") may be plastic or polycarbonate parts that are connected together (e.g. by press fitting and/or adhesive such as UV glue). Each of the external housings 450a and 450b encloses part of a respective straight pin 422 (the part in front of the pivot interference fitting 420), a compensating network 412, and one end of the pogo pin 440. The opposite front probing end of each pogo pin 440 protrudes from the respective housings 450a, 450b.

The compensating network 412 (which includes both shown compensating networks 412) of the swivel pogo tip pair adapter 400 is a miniature leaded resistor (for example, a 20 ohm resistor ±1% or a 30 ohm resistor ±1%). The compensating network 412 may include components such as resisters, capacitors, circuits, a combination of components, and/or other compensating means known or yet to be discovered. The compensating network 412 is preferably positioned at (or as near as possible to) the ends of the swivel pogo tip pair adapter 400 that is to contact the signal testing point 20. In this way, instead of only being optimized to the mechanical point of contact 16', the combination of the swivel pogo tip pair adapter 400 and the electrical test probe is optimized for bandwidth performance all the way to the signal testing point 20.

Miscellaneous

It should be noted that topographies other than that of an integrated circuit layout may be probed by the probing blade of the present invention.

It should be noted that the probing blade of the present invention may be used to provide a stable ground for high frequency probing and integrated circuit leg L probing. It should be noted that the probing blade is specifically not limited to a ground connection.

It should be noted that relational terms used in this specification are for purposes of clarity and are not meant to limit the scope of the invention. For example, the terms "top" and "bottom" or the terms "front" and "back" are meant to be relational and, if the probing blade were held in an alternative position, the terms could be reversed or changed completely to describe the new orientation.

The disclosures of the following applications and patents (that have been assigned to the assignee of the present application) are specifically incorporated herein by reference: U.S. patent application Ser. No. 12/715,269, U.S. Pat. No. 7,671, 613, and U.S. Provisional Patent Application Ser. No. 60/757, 077, filed Jan. 6, 2006.

It will thus be seen that the objects set forth above, among those made apparent from the preceding description, are efficiently attained and, since certain changes may be made in the above construction(s) without departing from the spirit and scope of the invention, it is intended that all matter contained in the description and/or shown in the accompanying drawings shall be interpreted as illustrative and not in a limiting sense.

It is also to be understood that the description and drawings are intended to cover all of the generic and specific features of the invention herein described and all statements of the scope of the invention which, as a matter of language, might be said to fall therebetween.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A conductive connector adapter having at least one transmission path, said conductive connector adapter for use with an electrical test probe having a mechanical point of contact, said conductive connector adapter for contacting at least one signal testing point, said conductive connector adapter comprising:
    (a) at least one transmission path extending longitudinally with said conductive connector adapter, each transmission path having a probing end and a head connection end;
    (b) at least one compensating network positioned substantially near said probing end of said at least one transmission path, each compensating network configured with a respective transmission path;
    (c) said at least one compensating network compensating for inductance caused by said conductive connector adapter;
    (d) said conductive connector adapter being a swivel pogo tip pair adapter;

(e) said at least one transmission path being a pair of transmission paths, each transmission path having a pogo pin held at an obtuse angle in relation to a straight pin of said transmission path at said probing end; and
(f) each said transmission path and the attached pogo pin being swivelable while said obtuse angle between said pogo pin and said transmission path is maintained;
(g) wherein said swivel pogo tip pair adapter may be used to probe signal testing points at different distances apart.

2. A conductive connector adapter having at least one transmission path, said conductive connector adapter for use with an electrical test probe having a mechanical point of contact, said conductive connector adapter for contacting at least one signal testing point, said conductive connector adapter comprising:
(a) at least one transmission path extending longitudinally with said conductive connector adapter, each transmission path having a probing end and a head connection end;
(b) at least one compensating network positioned substantially near said probing end of said at least one transmission path, each compensating network configured with a respective transmission path; and
(c) said at least one compensating network compensating for inductance caused by said conductive connector adapter;
(d) wherein said conductive connector adapter is a probing blade adapter comprising:
 (i) a flexible-deflectable extension having said at least one transmission path thereon; and
 (ii) a pogo-rotational-action pin attached at said probing end of said at least one transmission path.

3. The conductive connector adapter of claim 1, wherein said at least one compensating network is configured in serial with said at least one transmission path.

4. The conductive connector adapter of claim 1, wherein said at least one compensating network is configured in parallel with said at least one transmission path.

5. The conductive connector adapter of claim 1, wherein said at least one compensating network includes components selected from the group consisting of:
(a) at least one resister;
(b) at least one capacitor;
(c) a circuit; and
(d) a combination of components listed in (a)-(c).

6. A conductive connector adapter having at least one transmission path, said conductive connector adapter for use with an electrical test probe having a mechanical point of contact, said conductive connector adapter for contacting at least one signal testing point, said conductive connector adapter comprising:
(a) at least one transmission path extending longitudinally with said conductive connector adapter, each transmission path having a probing end and a head connection end;
(b) at least one compensating network positioned substantially near said probing end of said at least one transmission path, each compensating network configured with a respective transmission path;
(c) said at least one compensating network when used in combination with said electrical test probe being optimized to said signal testing point;
(d) said conductive connector adapter being a swivel pogo tip pair adapter;
(e) said at least one transmission path being a pair of transmission paths, each transmission path having a pogo pin held at an obtuse angle in relation to a straight pin said transmission path at said probing end; and
(f) each said transmission path and the attached pogo pin being swivelable while said obtuse angle between said pogo pin and said transmission path is maintained;
(g) wherein said swivel pogo tip pair adapter may be used to probe signal testing points at different distances apart.

7. A conductive connector adapter having at least one transmission path, said conductive connector adapter for use with an electrical test probe having a mechanical point of contact, said conductive connector adapter for contacting at least one signal testing point, said conductive connector adapter comprising:
(a) at least one transmission path extending longitudinally with said conductive connector adapter, each transmission path having a probing end and a head connection end;
(b) at least one compensating network positioned substantially near said probing end of said at least one transmission path, each compensating network configured with a respective transmission path; and
(c) said at least one compensating network when used in combination with said electrical test probe being optimized to said signal testing point;
(d) wherein said conductive connector adapter is a probing blade adapter comprising:
 (i) a flexible-deflectable extension having said at least one transmission path thereon; and
 (ii) a pogo-rotational-action pin attached at said probing end of said at least one transmission path.

8. The conductive connector adapter of claim 6, wherein said at least one compensating network is configured in serial with said at least one transmission path.

9. The conductive connector adapter of claim 6, wherein said at least one compensating network is configured in parallel with said at least one transmission path.

10. The conductive connector adapter of claim 6, wherein said at least one compensating network includes components selected from the group consisting of:
(a) at least one resister;
(b) at least one capacitor;
(c) a circuit; and
(d) a combination of components listed in (a)-(c).

11. The conductive connector adapter of claim 1, wherein said conductive connector adapter is a swivel pogo tip pair adapter, said at least one transmission path being a pair of transmission paths, each transmission path having a pogo pin attached at an angle to said transmission path at said probing end, said swivel pogo tip pair adapter being swivelable such that said swivel pogo tip pair adapter may be used to probe signal testing points at different distances apart.

12. The conductive connector adapter of claim 1, each transmission path having one of said at least one compensating network positioned between said pogo pin and said straight pin.

13. The conductive connector adapter of claim 6, each transmission path having one of said at least one compensating network positioned between said pogo pin and said straight pin.

* * * * *